(12) United States Patent
Kianian et al.

(10) Patent No.: US 6,952,033 B2
(45) Date of Patent: Oct. 4, 2005

(54) SEMICONDUCTOR MEMORY ARRAY OF FLOATING GATE MEMORY CELLS WITH BURIED BIT-LINE AND RAISED SOURCE LINE

(75) Inventors: Sohrab Kianian, Los Altos, CA (US); Chih Hsin Wang, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 13 days.

(21) Appl. No.: 10/105,741

(22) Filed: Mar. 20, 2002

(65) Prior Publication Data

US 2003/0178668 A1  Sep. 25, 2003

(51) Int. Cl.⁷ ............................................ H01L 29/788
(52) U.S. Cl. ...................... 257/315; 257/314; 257/317; 257/321
(58) Field of Search ........................ 257/321, 314–317; 365/185.01, 185.06, 185.13; 361/185.01, 361/185.06, 185.13

(56) References Cited

U.S. PATENT DOCUMENTS

| | | | |
|---|---|---|---|
| 4,757,360 A | 7/1988 | Faraone | |
| 4,794,565 A | 12/1988 | Wu et al. | |
| 4,882,707 A | 11/1989 | Mizutani | |
| 4,905,062 A | 2/1990 | Esquivel et al. | |
| 4,931,847 A | 6/1990 | Corda | |
| 4,947,221 A | 8/1990 | Stewart et al. | |
| 5,021,848 A | 6/1991 | Chiu | |
| 5,029,130 A | 7/1991 | Yeh | |
| 5,041,886 A | 8/1991 | Lee | |
| 5,049,515 A * | 9/1991 | Tzeng ........................ | 438/259 |
| 5,101,250 A | 3/1992 | Arima et al. | |
| 5,268,319 A | 12/1993 | Harari | |
| 5,338,953 A | 8/1994 | Wake ........................ | 257/316 |
| 5,381,028 A * | 1/1995 | Iwasa ........................ | 257/316 |
| 5,429,965 A | 7/1995 | Shimoji | |
| 5,495,441 A * | 2/1996 | Hong ..................... | 365/185.01 |
| 5,544,103 A | 8/1996 | Lambertson | |
| 5,572,054 A | 11/1996 | Wang et al. | |
| 5,780,341 A | 7/1998 | Ogura | |
| 5,780,892 A | 7/1998 | Chen | |
| 5,789,293 A | 8/1998 | Cho et al. | |

(Continued)

FOREIGN PATENT DOCUMENTS

EP  0 389 721 A2  10/1990

OTHER PUBLICATIONS

U.S. Appl. No. 09/401,622, Sep. 22, 1999, Johnson.

(Continued)

Primary Examiner—George Eckert
(74) Attorney, Agent, or Firm—DLA Piper Rudnick Gray Cary US LLP

(57) ABSTRACT

A self aligned method of forming an array of floating gate memory cells, and an array formed thereby, wherein each memory cell includes a trench formed into a surface of a semiconductor substrate, and spaced apart source and drain regions with a channel region formed therebetween. The drain region is formed underneath the trench, and the channel region includes a first portion that extends vertically along a sidewall of the trench and a second portion that extends horizontally along the substrate surface. An electrically conductive floating gate is formed over and insulated from a portion of the channel region. A raised source line of conductive material is disposed over the source region, and laterally adjacent to and insulated from the floating gate. An electrically conductive control gate is formed having a first portion disposed in the trench and a second portion formed over but insulated from the floating gate.

51 Claims, 17 Drawing Sheets

U.S. PATENT DOCUMENTS

| | | | |
|---|---|---|---|
| 5,796,139 A | | 8/1998 | Fukase |
| 5,808,328 A | | 9/1998 | Nishizawa |
| 5,811,853 A | | 9/1998 | Wang |
| 5,814,853 A | | 9/1998 | Chen |
| 5,943,572 A | | 8/1999 | Krautschneider |
| 5,998,261 A | * | 12/1999 | Hofmann et al. ........... 438/257 |
| 6,091,104 A | | 7/2000 | Chen |
| 6,103,573 A | | 8/2000 | Harari et al. |
| 6,140,182 A | | 10/2000 | Chen |
| 6,180,458 B1 | * | 1/2001 | Krautschneider et al. ... 438/259 |
| 6,222,227 B1 | | 4/2001 | Chen |
| 6,262,917 B1 | | 7/2001 | Lee |
| 6,316,298 B1 | * | 11/2001 | Lee ............................ 438/179 |
| 6,316,315 B1 | * | 11/2001 | Hofmann et al. ........... 438/259 |
| 6,521,944 B1 | * | 2/2003 | Mirgorodski ............... 257/317 |
| 6,538,275 B2 | | 3/2003 | Sugiyama et al. .......... 257/314 |
| 6,541,815 B1 | | 4/2003 | Mandelman et al. ....... 257/315 |
| 6,756,633 B2 | * | 6/2004 | Wang et al. ................. 257/317 |
| 2003/0073275 A1 | * | 4/2003 | Kianian ...................... 438/201 |

OTHER PUBLICATIONS

Hayashi, et al., "A Self-Aligned Split-Gate Flash EEPROM Cell With 3-D Pillar Structure," 1999 Symposium on VLSI Technology Digest of Technology Papers, pp. 87-88, Center for Integrated Systems, Stanford University, Stanford, CA 94305, USA.

SZE, Simon, "Physics of Semiconductor Devices", 2nd Edition, Wiley-Interscience, Basic Device Characteristics, pp. 438-439.

Brown, William D., et al..; "Nonvolatile Semiconductor Memory Technology, A Comprehensive Guide to Understanding And Using NVSM Devices", IEEE Press, pp. 33-34.

U.S. Appl. No. 10/653,015, Aug. 2003, Chen et al.
U.S. Appl. No. 10/776,397, Feb. 2004, Kianian et al.
U.S. Appl. No. 10/818,590, Apr. 2004, Kianian et al.
U.S. Appl. No. 10/776,483, Feb. 2004, Kianian et al.

* cited by examiner

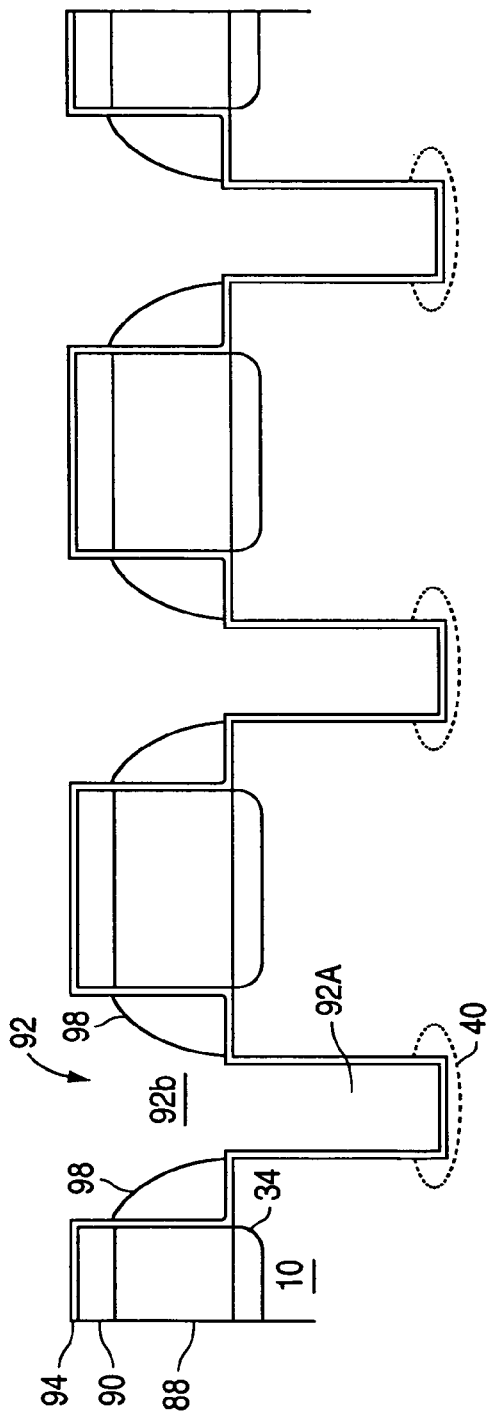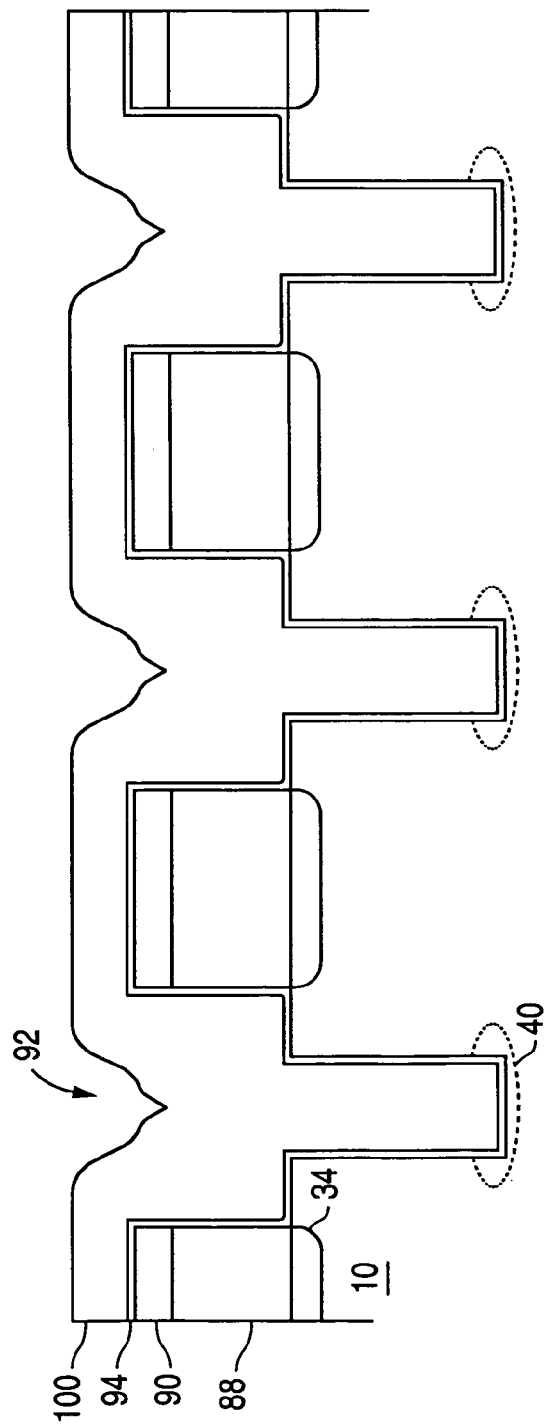

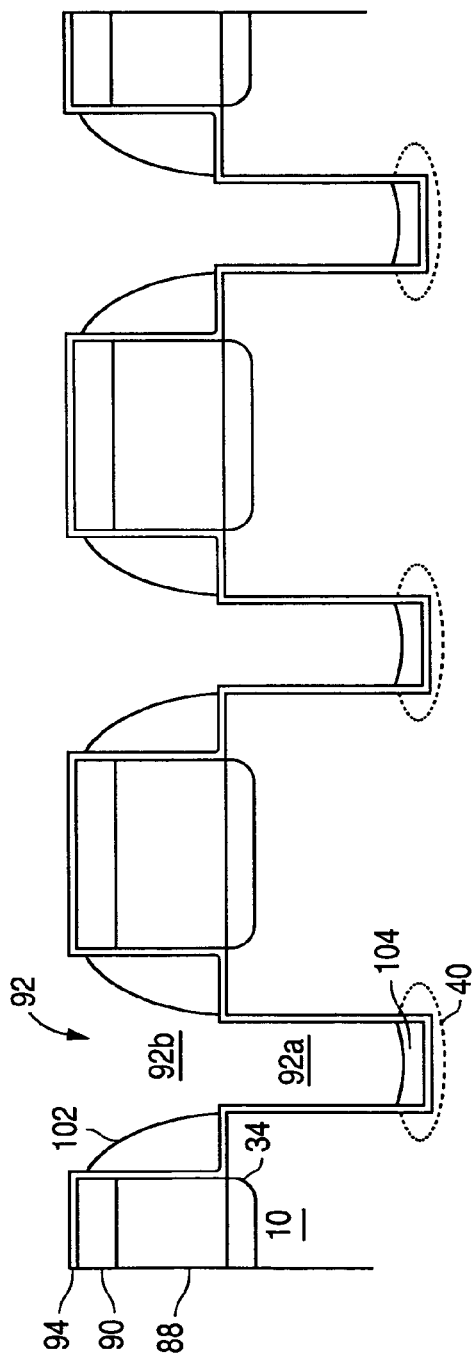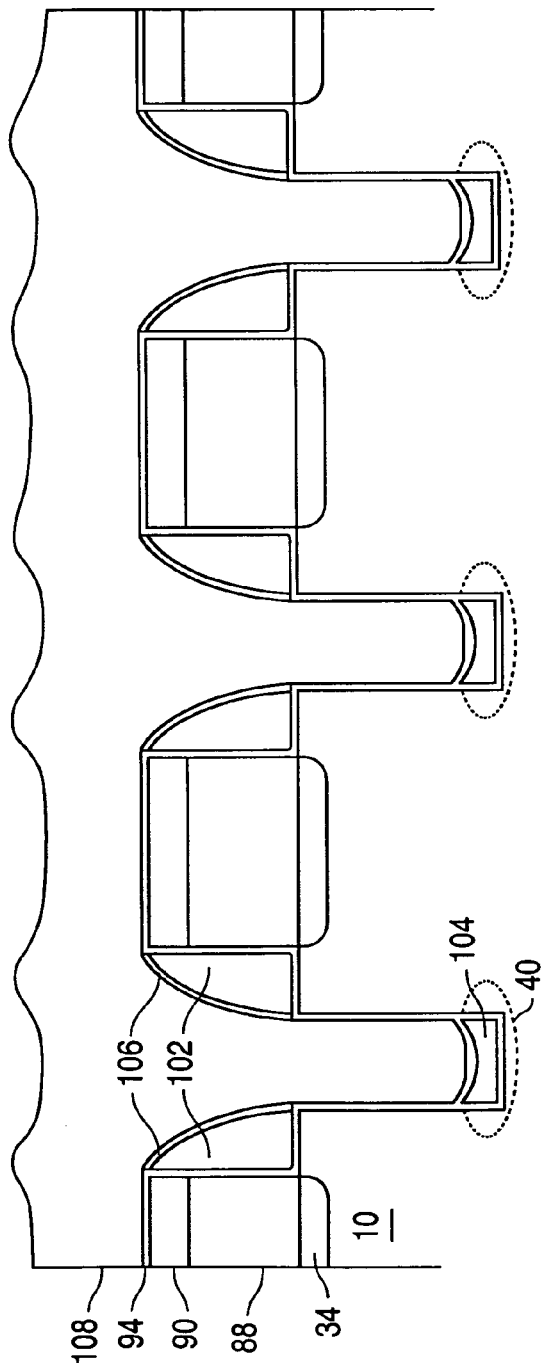

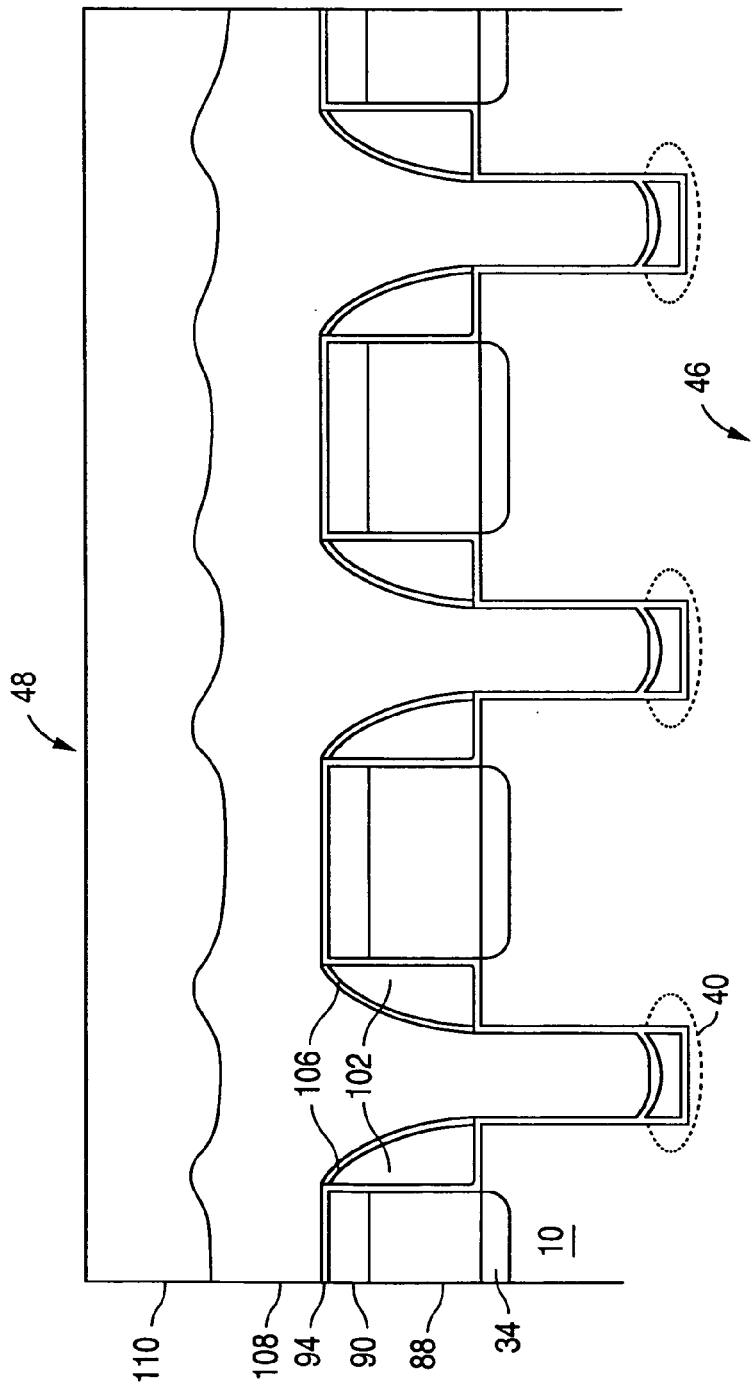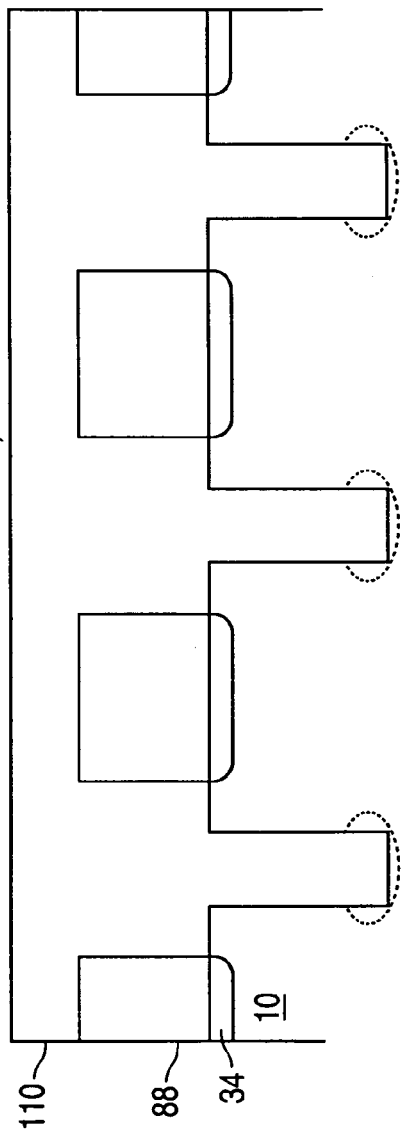
FIG. 8M
FIG. 8N

SEMICONDUCTOR MEMORY ARRAY OF FLOATING GATE MEMORY CELLS WITH BURIED BIT-LINE AND RAISED SOURCE LINE

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is also a constant need to shrink the size of the memory cell arrays in order to maximize the number of memory cells on a single wafer. It is well known that forming memory cells in pairs, with each pair sharing a single source region, and with adjacent pairs of cells sharing a common drain region, reduces the size of the memory cell array. However, a large area of the array is typically reserved for the bit-line connection to the drain regions. The bit-line area is often occupied by the contact openings between memory cell pairs, and the contact to wordline spacing, which strongly depends upon lithography generation, contact alignment and contact integrity. In addition, significant space is reserved for the word-line transistor, the size of which is set by lithography generation and junction scaling.

There is a need for a non-volatile, floating gate type memory cell array with significant cell size reduction.

SUMMARY OF THE INVENTION

The present invention solves the above mentioned problems by providing a self aligned method of forming memory cells with reduced size, by minimizing the space needed for the bit-line connection and word-line transistor, and a memory cell array formed thereby.

The electrically programmable and erasable memory device of the present invention includes a substrate of semiconductor material of a first conductivity type, a trench formed into a surface of the substrate, first and second spaced-apart regions formed in the substrate and having a second conductivity type with a channel region formed in the substrate therebetween, wherein the second region is formed underneath the trench and the channel region includes a first portion that extends substantially along a sidewall of the trench and a second portion that extends substantially along the surface of the substrate, a block of conductive material disposed over the first region, an electrically conductive floating gate disposed over and insulated from at least a portion of the channel region and disposed laterally adjacent to and insulated from the block of conductive material, and an electrically conductive control gate having a first portion disposed in the trench.

In another aspect of the present invention, an array of electrically programmable and erasable memory devices includes a substrate of semiconductor material of a first conductivity type, spaced apart isolation regions formed on the substrate which are substantially parallel to one another and extend in a first direction, with an active region between each pair of adjacent isolation regions, a plurality of trenches formed into a surface of the substrate which are substantially parallel to one another and extend across the isolation and active regions in a second direction that is substantially perpendicular to the first direction, a plurality of electrically conductive control gates, and a plurality of memory cells in each of the active regions. Each of the memory cells includes first and second spaced-apart regions formed in the substrate having a second conductivity type, with a channel region formed in the substrate therebetween, wherein the second region is formed underneath one of the trenches, and wherein the channel region has a first portion extending substantially along a sidewall of the one trench and a second portion extending substantially along the surface of the substrate, a block of conductive material disposed over the first region, and an electrically conductive floating gate disposed over and insulated from at least a portion of the channel region and disposed laterally adjacent to and insulated from the block of conductive material. The plurality of electrically conductive control gates each extends along one of the active regions, wherein the control gates each have first portions disposed in the trenches.

In yet another aspect of the present invention, a method of forming a semiconductor memory cell comprises the steps of: forming a first region in a semiconductor substrate, wherein the substrate has a first conductivity type and the first region has a second conductivity type, forming a trench into a surface of the semiconductor substrate, wherein the trench is spaced apart from the first region, forming a second region in the substrate and underneath the trench, wherein the second region has the second conductivity type and a channel region in the substrate is defined between the first and second regions, the channel region includes a first portion that extends substantially along a sidewall of the trench and a second portion that extends substantially along the substrate surface, forming a block of conductive material disposed over the first region, forming a floating gate of electrically conductive material disposed over and insulated from at least a portion of the channel region, and disposed laterally adjacent to and insulated from the block of conductive material, and forming a control gate of electrically conductive material having a first portion disposed in the trench.

In still yet another aspect of the present invention, a method of forming an array of semiconductor memory cells comprises the steps of: forming a plurality of first regions in a semiconductor substrate that are substantially parallel to one another and extend in a first direction, wherein the substrate has a first conductivity type and the first regions have a second conductivity type, forming a plurality of trenches into a surface of the semiconductor substrate, wherein the trenches are spaced apart from and extend substantially parallel to the first regions, forming a plurality of second regions in the substrate having the second conductivity type and are substantially parallel to one another, each of the second regions extends in the first direction and is formed underneath one of the trenches, wherein a plurality of channel regions in the substrate are defined each having a first portion extending substantially along a sidewall of one of the trenches and a second portion that extends substantially along the substrate surface between the one trench and one of the first regions, forming a plurality of blocks of conductive material that are substantially parallel to one another and extend in the first direction, wherein each of the conductive blocks is disposed over one of the first regions, forming a plurality of floating gates of electrically conductive material each disposed over and insulated from at least a portion of one of the channel regions, and disposed laterally adjacent to and insulated from one of the blocks of conductive material, and forming a plurality of control gates of electrically conductive material each having a first portion disposed in one of the trenches, and a second portion disposed over and insulated from one of the floating gates.

In one more aspect of the present invention, an electrically programmable and erasable memory device includes a substrate of semiconductor material of a first conductivity type, first and second spaced-apart regions formed in the substrate and having a second conductivity type, with a non-linear channel region therebetween, a block of conductive material disposed over the first region, and a floating gate disposed over and insulated from a surface of the substrate and disposed laterally adjacent to and insulated from the block of conductive material. The channel region defines a path for programming the floating gate with electrons from the second region.

In another aspect of the present invention, an electrically programmable and erasable memory device includes a substrate of semiconductor material of a first conductivity type, an electrically conductive control gate having a first portion formed in the substrate, first and second spaced-apart regions formed in the substrate and having a second conductivity type, with a non-linear channel region therebetween, wherein the second region is formed underneath and is insulated from the control gate first portion, and the channel region includes a first portion that extends substantially along the control gate first portion and a second portion that extends substantially along a surface of the substrate, a block of conductive material disposed over the first region, and an electrically conductive floating gate disposed over and insulated from at least a portion of the channel region and disposed laterally adjacent to and insulated from the block of conductive material.

In still another aspect of the present invention, an array of electrically programmable and erasable memory devices includes a substrate of semiconductor material of a first conductivity type and having a surface, spaced apart isolation regions formed on the substrate which are substantially parallel to one another and extend in a first direction, with an active region between each pair of adjacent isolation regions, each of the active regions including a plurality of memory cells, wherein each of the memory cells includes an electrically conductive floating gate disposed over and insulated from the substrate surface, a plurality of first regions formed in the substrate and having a second conductivity type, each of the first regions extends across the active regions and isolation regions in a second direction perpendicular to the first direction, a plurality of second regions formed in the substrate and having the second conductivity type, each of the second regions extends across the active regions and the isolation regions in the second direction and is disposed between a pair of the first regions, wherein the second regions are buried underneath the substrate surface, a plurality of blocks of conductive material that are substantially parallel to one another and extend across the active regions and isolation regions in the second direction, wherein each of the blocks of conductive material is disposed over one of the first regions and includes portions that are disposed laterally adjacent to and insulated from the floating gates, and a plurality of electrically conductive control gates each extending along one of the active regions in the first direction.

In one last aspect of the present invention, an array of electrically programmable and erasable memory devices includes a substrate of semiconductor material of a first conductivity type, spaced apart isolation regions formed on the substrate which are substantially parallel to one another and extend in a first direction, with an active region between each pair of adjacent isolation regions, a plurality of spaced apart first and second regions formed in the semiconductor substrate having a second conductivity type and extending across the active and isolation regions in a second direction substantially perpendicular to the first direction, wherein the first and second regions have a second conductivity type and define a plurality of channel regions formed in the substrate therebetween, a plurality of blocks of conductive material that are substantially parallel to one another and extend in the second direction, wherein each of the conductive blocks is disposed over and electrically connected to one of the first regions, a plurality of floating gates of electrically conductive material each disposed over and insulated from at least a portion of one of the channel regions, and disposed laterally adjacent to and insulated from one of the blocks of conductive material, and a plurality of control gates of electrically conductive material extending in the first direction and having portions that are each disposed over and insulated from one of the floating gates.

Other objects and features of the present invention will become apparent by a review of the specification, claims and appended figures.

DETAILED DESCRIPTION OF THE PREFERRED EMBODIMENTS

Figure 1A:
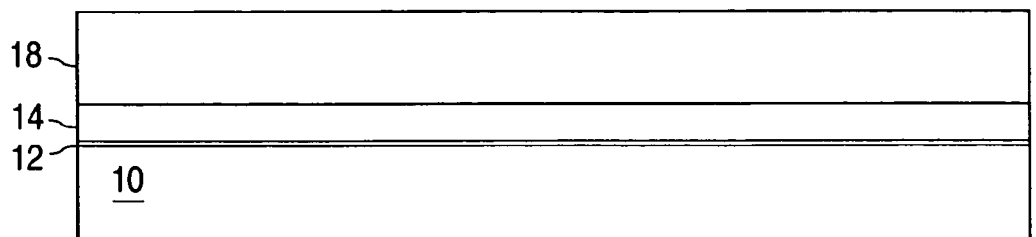
FIGS. 1A–1K are cross sectional views of a semiconductor structure showing in sequence the steps in the processing of the semiconductor structure in the formation of a non volatile memory array of floating memory cells of the present invention.
Figure 1B:
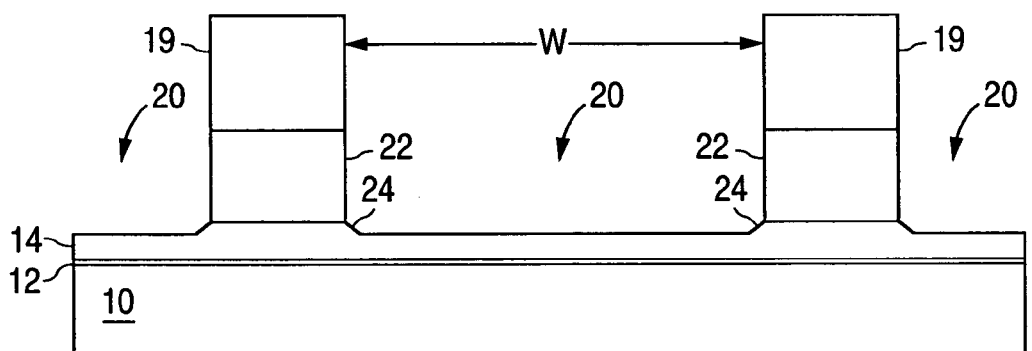
Figure 1C:
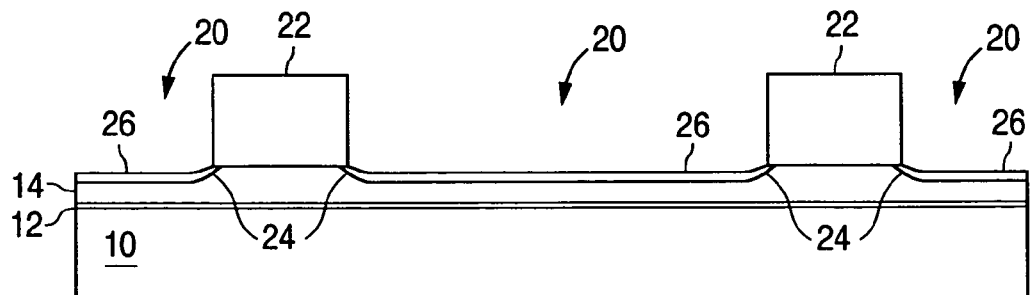
Figure 1D:
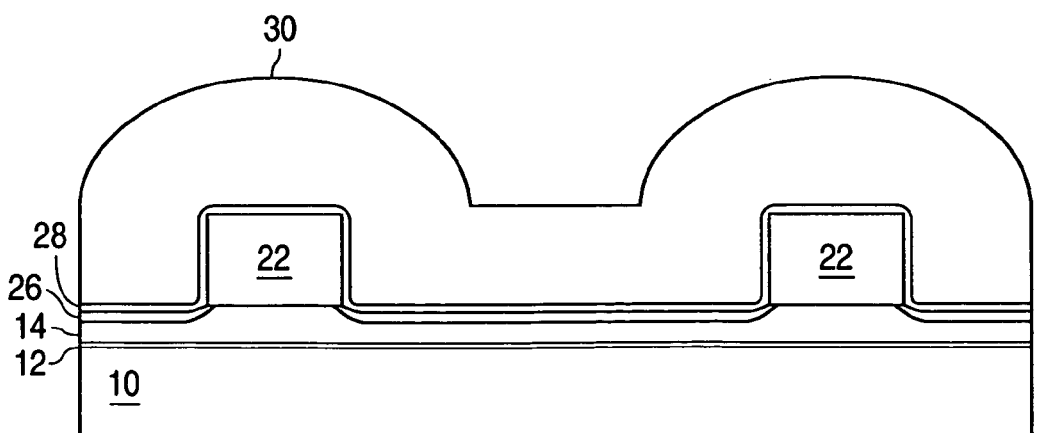
Figure 1E:
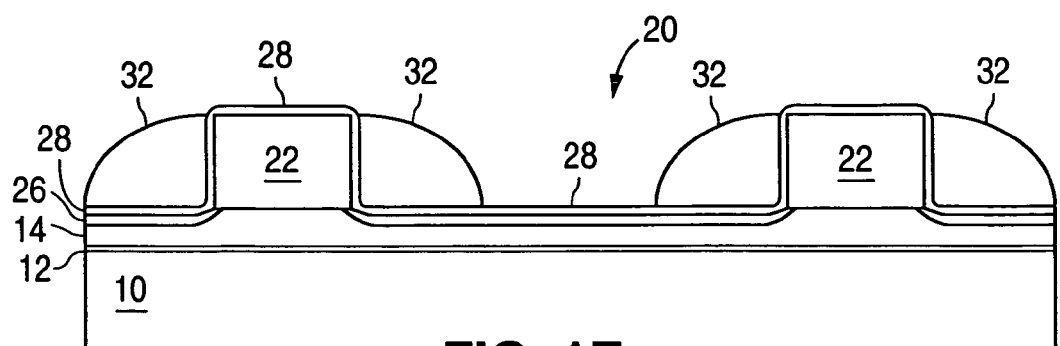
Figure 1F:
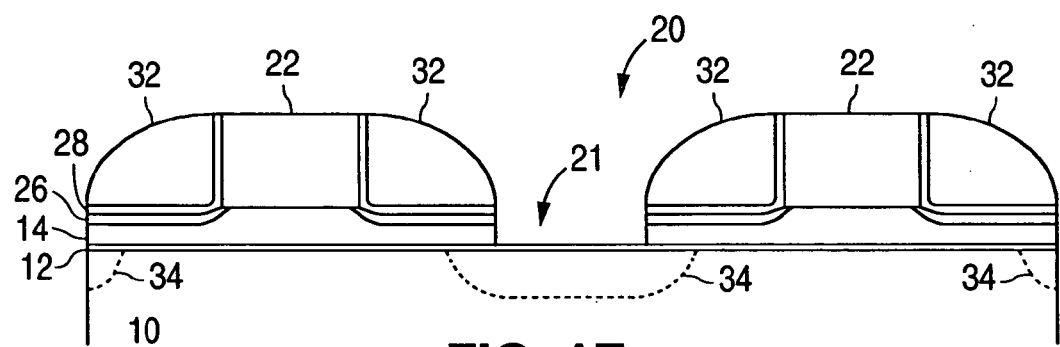
Figure 1G:
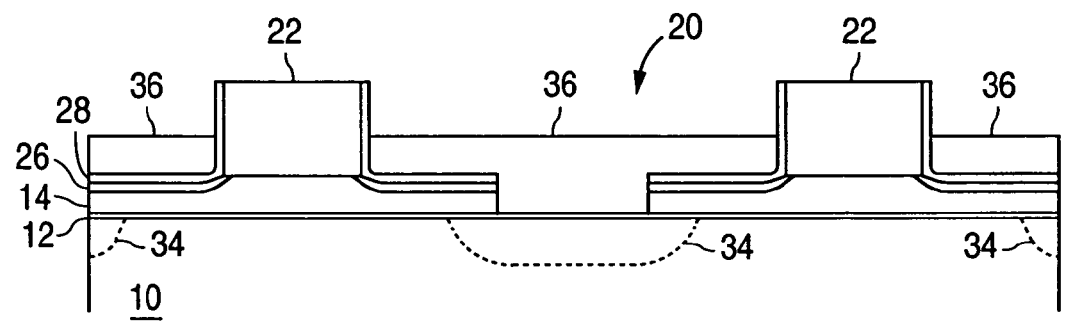
Figure 1H:
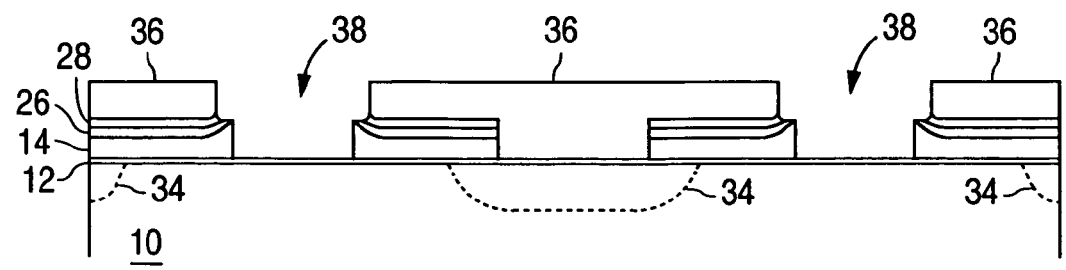
Figure 1I:
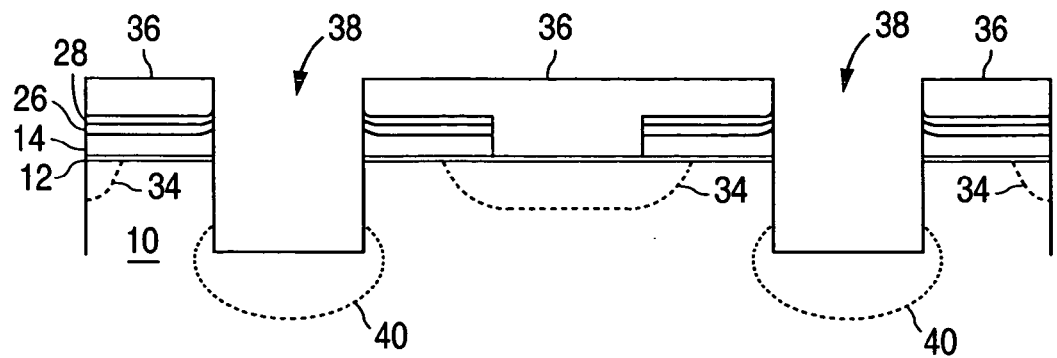
Figure 1J:
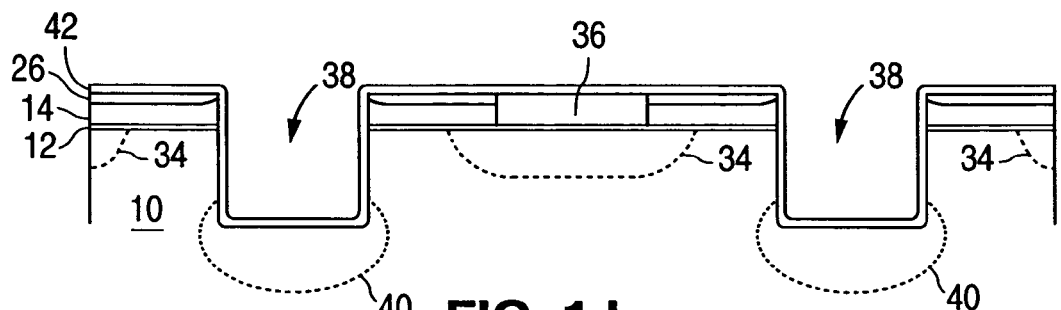
Figure 1K:
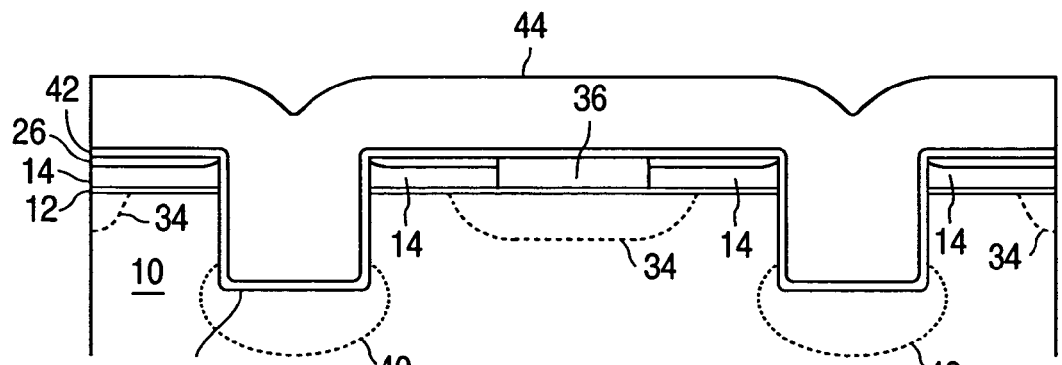
Figure 1M:
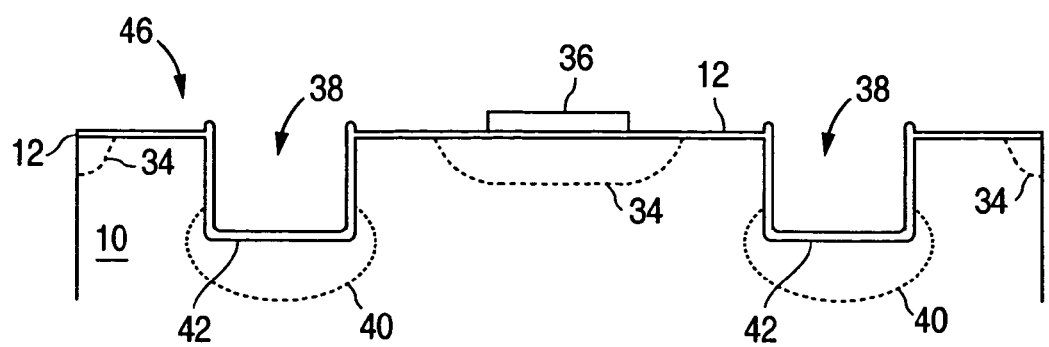
FIG. 1M is a cross sectional view showing the next step(s) in the processing of the inactive regions formed by the process of the present invention.
Figure 1L:
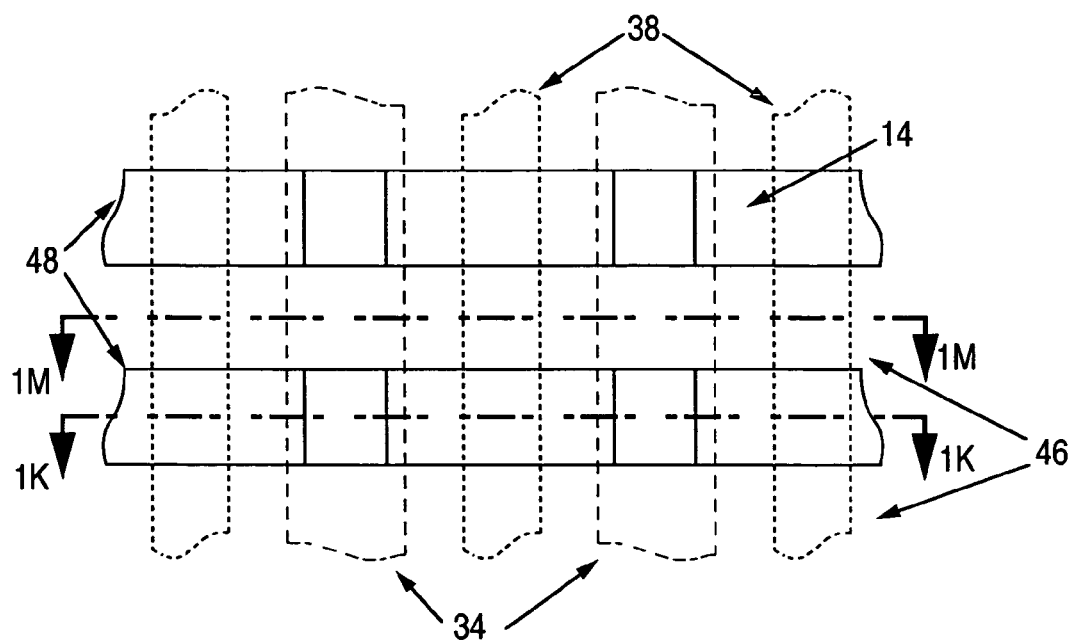
FIG. 1L is a top view showing the active and inactive regions, and the intersection thereof with the source and bit lines, formed by the process of the present invention.
Figure 1N:
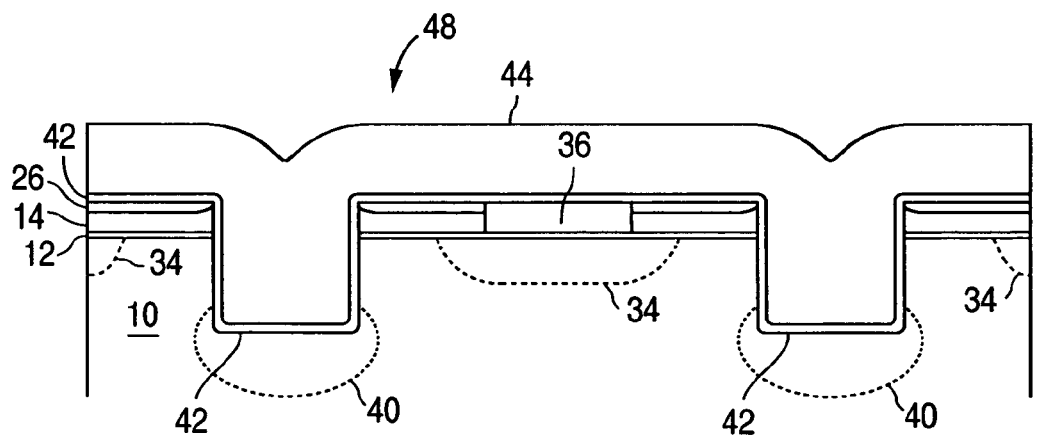
FIG. 1N is a cross sectional view showing the next step(s) in the processing of the active regions formed by the process of the present invention.
Figure 1O:
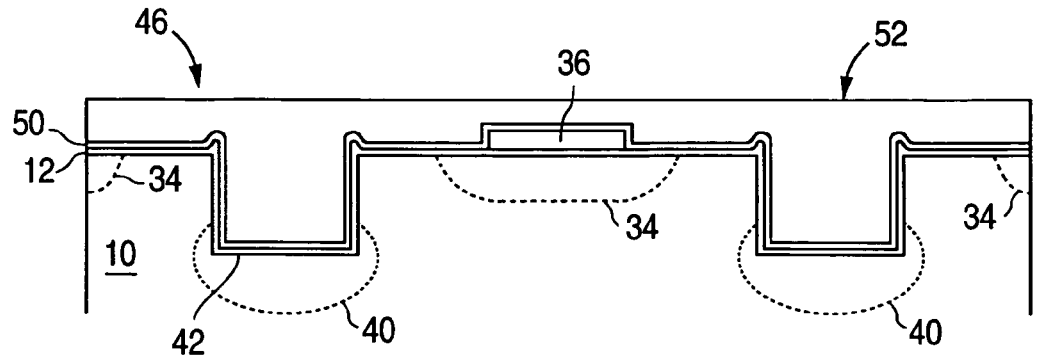
FIG. 1O is a cross sectional view showing the next step(s) in the processing of the inactive regions formed by the process of the present invention.

The method of the present invention is illustrated in FIGS. 1A–1O, and begins with a semiconductor substrate 10, which is preferably of P type and is well known in the art. The thicknesses of the layers described below will depend upon the design rules and the process technology generation. What is described herein is for the 0.13 micron process. However, it will be understood by those skilled in the art that the present invention is not limited to any specific process technology generation, nor to any specific value in any of the process parameters described hereinafter. As shown in FIG. 1A, a thin layer of insulation material 12, such as silicon dioxide (hereinafter "oxide") having a thickness approximately 80 Å, is formed on substrate 10 by any well known technique such as oxidation or deposition (e.g. chemical vapor deposition or CVD). A layer of conductive material 14, such as polysilicon (hereinafter "poly"), is deposited with an approximate thickness of 700 Å on top of the layer of insulation material 12 by any well known process such as Low Pressure CVD or LPCVD. Poly layer 14 may be doped by ion implantation. Another layer of insulation material 18, such as silicon nitride (hereinafter "nitride"), is deposited with an approximate thickness of 3000 Å over the poly layer 14, preferably by CVD.

Once the oxide layer 12, the poly layer 14, and nitride layer 18 have been formed, a conventional photo-lithography scheme is used to form semi-recessed first trenches 20 in the structure in the following manner. A suitable photo-resistant material 19 is applied on the nitride layer 18 and a masking step is performed to selectively remove the photo-resistant material 19 from selected parallel stripe regions (under which the first trenches 20 will be formed). Where the photo-resist material 19 is removed, the exposed silicon nitride 18 is removed using a standard nitride etch process (e.g. anisotropic nitride etch), leaving blocks of nitride 22 and first trenches 20 formed therebetween. An optional poly etch follows to recess the top portion of poly layer 14, and to create sloped regions 24 where the poly layer 14 meets the nitride blocks 22. The width W of first trenches 20 can be as small as the smallest lithographic feature of the process used. Where the photo resist 19 is not removed, the underlying nitride layer 18, poly layer 14 and oxide layer 12 are maintained. The resulting structure is illustrated in FIG. 1B.

The structure is further processed to remove the remaining photo resist 19. Then, a thermal oxidation process is used to oxidize the poly layer 14 to form a lens-shaped oxide layer 26 over the exposed portions of poly layer 14, as shown in FIG. 1C. The lens shape is caused by the sloping portions 24 of the underlying poly layer 14, and the nitride region 22 blocking oxidation at the poly-nitride interface.

A thin layer of nitride 28 (~400 Å) is formed over the structure (e.g. using convention chemical vapor deposition (CVD)), which is used to protect the lens-shaped oxide layer 26. Insulation spacers 32 are then formed along the side wall surfaces of first trenches 20. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. Spacers 32 can be formed of any dielectric material with good etch selectivity to nitride layer 28. In the structure illustrated in FIG. 1C, insulation spacers 32 are formed of oxide by depositing a thick layer 30 of oxide (~2500 Å) over the entire structure, as shown in FIG. 1D. An anisotropic etch process, such as the well known Reactive Ion Etch (RIE), is used to remove the deposited oxide layer 30, except for spacers 32, as shown in FIG. 1E. This etch process uses the nitride layer 28 as an etch stop.

Narrower lower portions 21 of first trenches 20 are formed by a series of anisotropic etch steps for layers of materials that are left exposed between spacers 32, starting with a thin nitride etch step that removes the exposed portions of nitride layer 28. This nitride etch uses oxide layer 26 as an etch stop, and also removes the exposed portions of nitride layer 28 on top of nitride blocks 22. An oxide etch is then used to remove the exposed portions of oxide layer 26, with poly layer 14 used as an etch stop. During this etch step, some of the exposed spacer oxide 32 may be removed. A poly etch step is then used to remove the exposed portions of poly layer 14 to expose oxide layer 12 at the bottom of each of the first trenches 20. Suitable ion implantation is then made across the entire surface of the structure. Where the ions have sufficient energy to penetrate exposed portions of oxide layer 12 in each first trench 20, they then form first regions (source line regions) 34 in the substrate 10. In all other regions, the ions are absorbed by the underlying structure, where they have no effect. The implanted source regions 34 are formed in parallel lines that are self aligned to the lower portions 21 of first trenches 20. A mask (not shown) should be used along the edges of the array to block the implantation of regions 34 and prevent adjacent source regions 34 from being shorted together. The resulting structure is shown in FIG. 1F.

A thick oxide layer 36 is deposited over the structure, followed by a planarization oxide etch process (e.g. Chemical-Mechanical-Polishing or CMP etch) that etches the thick oxide layer 36 down to the tops of nitride blocks 22, which are used as the etch stop. Oxide layer 36 is further anisotropically etched (e.g. by RIE) below the tops of nitride blocks 22, resulting in the structure shown in FIG. 1G.

Parallel second trenches 38 extending down to oxide layer 12 are formed by first performing a nitride etch process to remove nitride blocks 22 and the exposed portions of nitride layer 28, followed by a poly etch step that removes the exposed portions of poly layer 14. The resulting structure is shown in FIG. 1H.

Exposed portions of oxide layer 12 at the bottom of second trenches 38 and oxide layer 26 are removed by an anisotropic oxide etch process, leaving portions of the substrate 10 exposed. A silicon etch process is used to remove exposed portions of poly layer 14, and to extend second trenches 38 down into the substrate 10 (preferably to a depth of approximately $0.2 \mu m$). Suitable ion implantation is once again made across the entire surface of the structure. The ion implantation forms second regions 40 (buried bit-line regions) in the substrate 10 underneath second trenches 38. Outside of second trenches 38, the ions are blocked by the dielectric oxide layer 36, where they have no effect. The resulting structure is shown in FIG. 1I.

An oxide etch (preferably a dry oxide etch using nitride layer 28 as an etch stop) is used to remove oxide layer 36, except for the portions disposed in the lower portions 21 of first trenches 20. A thin nitride etch follows which removes nitride layer 28 (and uses oxide layer 26 as an etch stop). A thin layer of oxide 42 is then formed over the entire structure, including inside second trenches 38, using for example an HTO oxide deposition process. The resulting structure is shown in FIG. 1J.

A thick poly layer 44 is deposited over the structure (e.g. ~$0.18 \mu m$), including filling second trenches 38. Poly layer 44 can be doped by ion implant, or by an in-situ process. An optional layer (not shown) of metalized silicon (polycide) can be formed on top of poly layer 44 by depositing a metal such as tungsten, cobalt, titanium, nickel, platinum, or molybdenum over the structure, and then annealing the structure to permit the hot metal to flow and to seep into the top portion of poly layer 44 to form the conductive layer of polycide. The resulting structure is shown in FIG. 1K. As described later, oxide layer 42, together possibly with part of oxide layer 26, form an insulation layer having a thickness that permits Fowler-Nordheim tunneling therethrough.

Thus far, the structure shown in FIG. 1K was formed with one masking step, with trenches 38 extending in a first direction. Parallel active and inactive stripe regions, that extend across and are perpendicular to the first direction of the second trenches 38, are formed in the following manner. A photo-resistant material is applied to the structure shown in FIG. 1K, and a masking step is performed to selectively remove the photo-resistant material from parallel stripe regions 46, as shown in FIG. 1L. This masking step defines alternating parallel active (word line) regions 48 (in which active memory cells are formed) and inactive regions 46 (in which no active memory cells will be formed). A series of etch processes are then performed, which do not affect the active regions 48 (which are protected by the photo-resistant material). First, a (dry) poly etch is performed to remove the exposed poly layer 44 outside of second trenches 38 in the inactive regions 46, using oxide layer 42 as an etch stop. An oxide etch is then performed to remove the oxide layers 42 and 26 disposed over poly layer 14, using the poly layer 14 as an etch stop. A poly etch follows, which removes the poly layer 14 and the remaining poly layer 44 inside of second trenches 38. The photo-resistant material in the active regions 48 is then removed. The active regions 48 remain unchanged from the structure shown in FIG. 1K, while the resulting structure in the inactive regions 46 is illustrated in FIG. 1M.

A thin layer of oxide 50 is formed over the structure (e.g. thermally grown, HTO, or CVD deposit), followed by the deposition of a thick layer of oxide 52 over the structure which fills second trenches 38 in the inactive regions 46. A planarizing oxide etch (e.g. CMP) is then used to level out oxide layer 52. An oxide etch follows to fully expose the poly layer 44 in the active regions 48. The resulting structure in the active regions 48 is shown in FIG. 1N (which is unchanged from FIG. 1K), and the structure in the inactive regions 46 is shown in FIG. 1O.

Figure 2A:
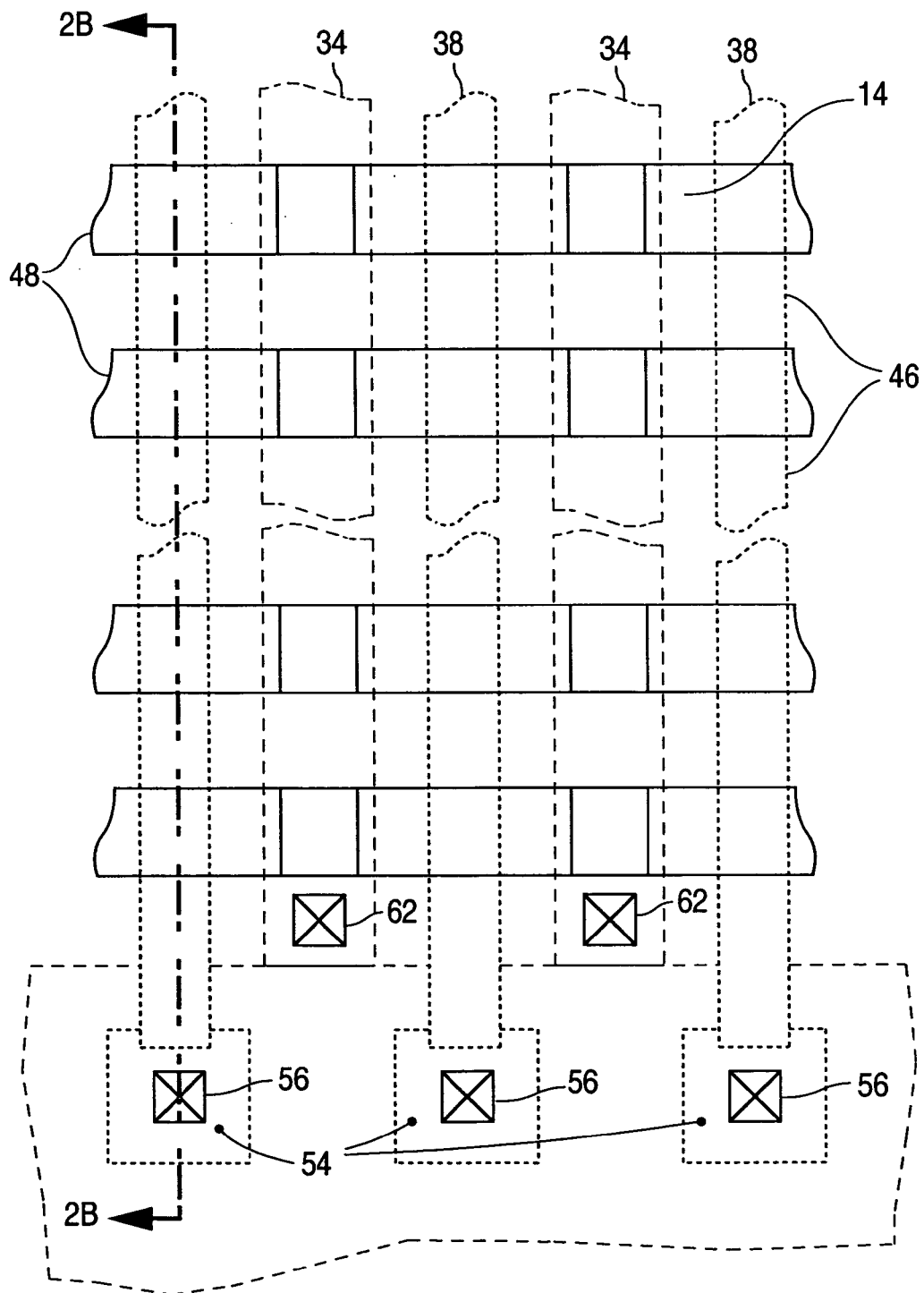
FIG. 2A is a top view showing the active and inactive regions, the intersection thereof with the source and bit lines, and the bit strap implant regions, formed by the process of the present invention.

FIG. 2A illustrates a top view of the resulting memory cell array, which includes rows of alternating active regions 48 and inactive regions 46, and columns of alternating source line regions 34 and second (bit-line) trenches 38 formed in the substrate 10. Bit line regions 40 are formed under the second (bit-line) trenches 38.

Figure 2B:
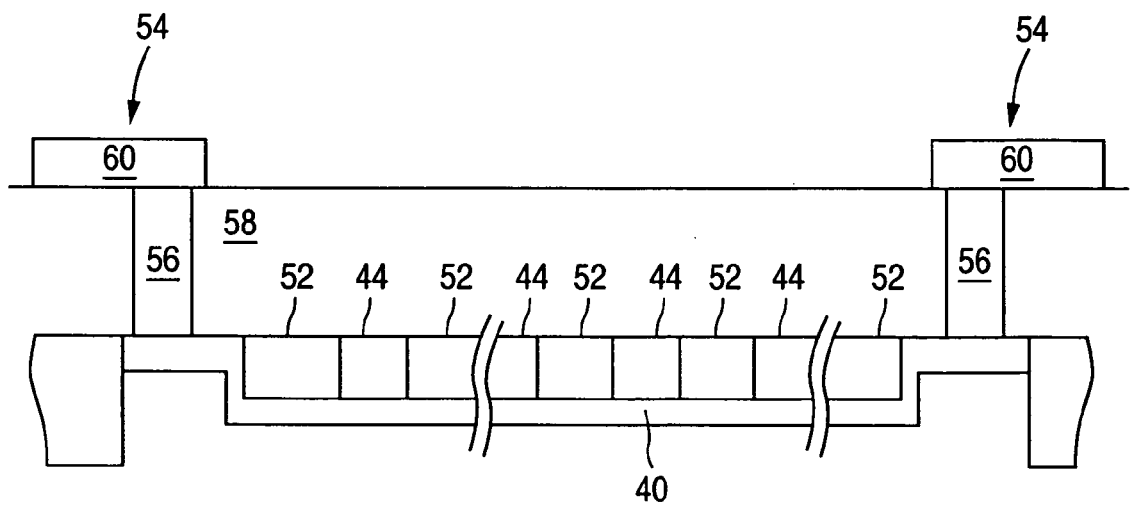
FIG. 2B is a cross sectional view of one of the second trenches, including the bit strap implant areas of the present invention.

As shown in FIGS. 2A and 2B, at one edge of the array, bit-line strap implant areas 54 are formed in which the second (buried bit-line) region 40 rises up to the surface of the silicon substrate 10. There are several ways to form the rising portions of second region 40. A mask is used to cover the structure except for the gap between the buried and surface portions of second region 40. An implant step is performed wherein the implant energy is selected so that the implanted area joins the buried and surface portions of second region 40. Alternately, a large angle implant can be used to form second regions 40 at the bottom of trenches 38, which will also create the rising portions of second region 40 up to the substrate surface.

Contacts 56 (preferably metal) are formed over the substrate 10 to make electrical contact with the raised portions of second (buried bit-line) regions 40. Contacts 56 are preferably formed by depositing passivation, such as BPSG 58, over the entire structure. A masking step is performed to define etching areas over the raised portions of the second (buried bit-line) regions 40. The BPSG 58 is selectively etched in the masked regions to create contact openings, which are then filled with a conductor metal 56 by metal deposition and planarization etch-back. Bit line connectors 60 are added by metal masking over the BPSG 58, to connect to contacts 56. Metal contacts 62 are also formed in the same manner in one or more of the inactive regions 46 to connect with the source line regions 34, which includes an oxide etch to remove portions of oxide layers 12, 36, 50 and 52 disposed over the source regions 34. It should be noted that strap implant areas can be formed at the ends of the memory arrays, and/or at one or more intermediate locations throughout the memory cell array.

Figure 3:
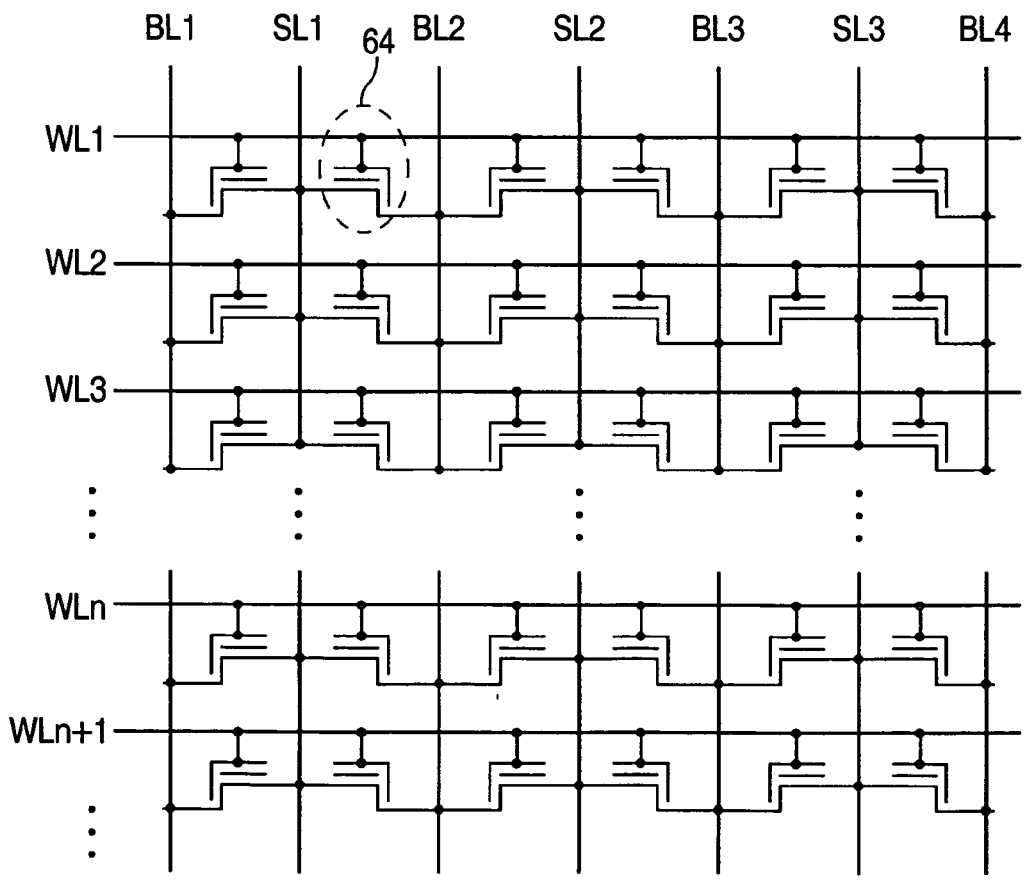
FIG. 3 is a schematic diagram of the memory cell array of the present invention, with control gate transistor portions formed in the trench side-wall areas schematically shown as vertical gates.

FIG. 3 is a schematic circuit diagram of the memory cell array formed by the above described process. There are a plurality of memory cells 64 arranged in rows and columns. The rows of word lines (WL1, WL2, WL3, . . . WLn+1) correspond to the stripes of (WL) poly layer 44 that extend along the row length of the active regions 48. The alternating columns of bit-lines (BL1, BL2, . . . ) and source lines (SL1, SL2, . . . ) correspond to the buried bit line regions 40 and the source line regions 34, respectively, formed in the substrate that traverse the rows of active regions 48.

Figure 4:
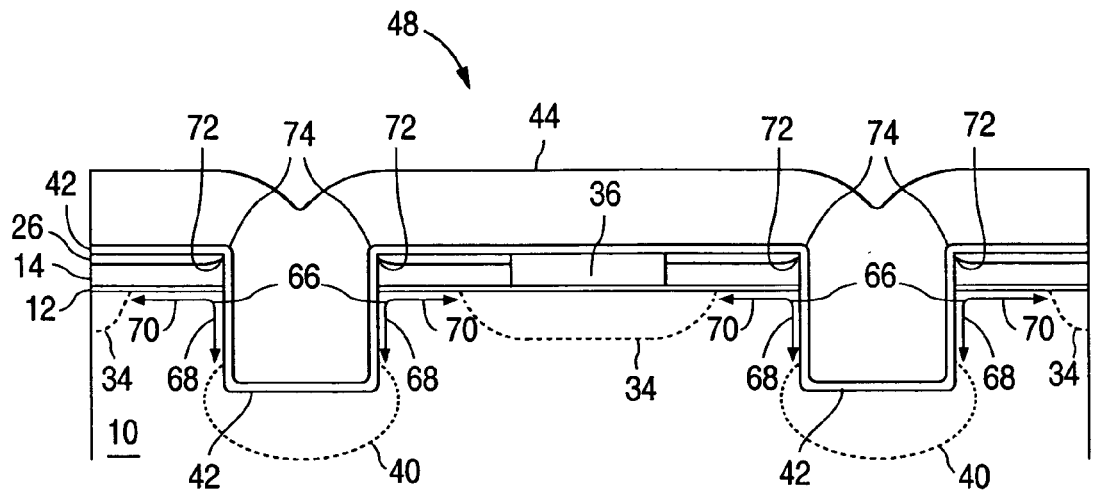
FIG. 4 is a cross sectional view of the active regions showing the memory cell structure of the present invention.

FIG. 4 illustrates the final structure of the memory cells 64 formed in the active regions 48. First and second regions 34/40 form the source and drain for each cell (although those skilled in the art know that source and drain can be switched during operation). Poly layer 14 constitutes the floating gate, and the portions of poly layer 44 disposed in second trenches 38 and over floating gate 14 constitutes the control gate for each of the memory cells. The channel region 66 for each cell is the surface portion of the substrate that is in-between the source and drain 34/40. The channel region 66 for each memory cell has two portions joined together at a right angle, with a vertical portion 68 extending along the vertical wall of second trench 38 and a horizontal portion 70 extending between the second trench 38 and the source region 34. The floating gate 14 is disposed over, but insulated from, the horizontal portion 70 of the channel region 66, and a portion of the source region 34. The floating gates 14 each have a sharp edge 72 that faces toward a notch 74 formed in the control gates 44 over the edges of second trenches 38. As illustrated in the FIG. 4, the process of the present invention forms pairs of memory cells that mirror each other, with a memory cell formed on each side of the second trenches 38 that share a common bit-line region 40. Similarly, each source line region 34 is shared between adjacent memory cells from different mirror sets of memory cells. The entire row of memory cells shares a single poly layer 44 that acts as the control gate for all the memory cells in that row.

Memory Cell Operation

Figure 5:
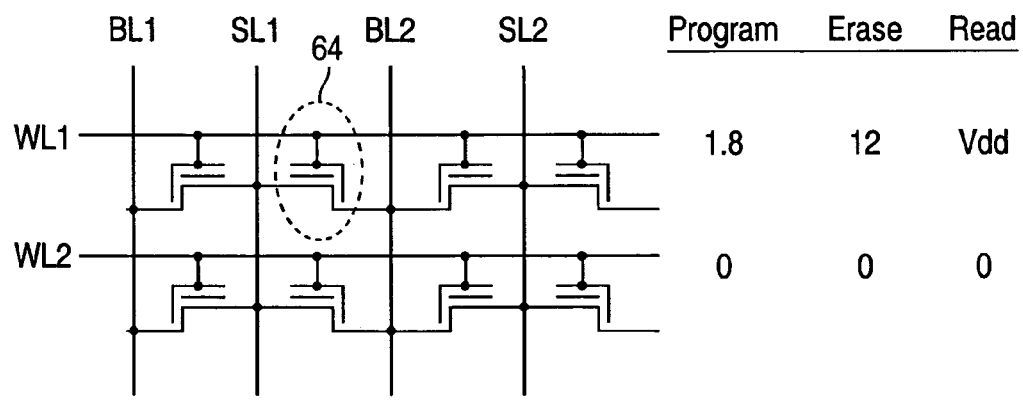
FIG. 5 is a schematic diagram showing the operation of the memory cell array of the present invention.

The operation of the memory cells will now be described below with reference to FIGS. 4 and 5. The operation and theory of operation of such memory cells are also described in U.S. Pat. No. 5,572,054, whose disclosure is incorporated herein by reference with regard to the operation and theory of operation of a non-volatile memory cell having a floating gate and a control gate, floating gate to control gate tunneling, and an array of memory cells formed thereby.

To initially erase a selected memory cell 64 in any given active region 48, a ground potential is applied to both its source 34 and drain 40. A high-positive voltage, on the order of +12 volts, is applied to the control gate 44. Electrons on the floating gate 14 are induced through the Fowler-Nordheim tunneling mechanism to tunnel through the oxide layer 42 to the control gate 44, leaving the floating gate 14 positively charged. Tunneling is enhanced by the sharp edge 72 formed on each floating gate 14. It should be noted that since the control gate 44 runs along the length of the active region 48, the entire row of memory cells 64 in the selected active region 48 are 'erased'.

When a selected memory cell 64 is desired to be programmed, a small voltage (e.g. 0.5 to 1.0 V) is applied to its drain region 40. A positive voltage level in the vicinity of the threshold voltage of the MOS structure defined by the control gate 44 (on the order of approximately +1.8 volts) is applied to its control gate 44. A positive high voltage, on the order of 9 or 10 volts, is applied to its source region 34. Electrons generated by the drain region 40 will flow from the drain region 40 towards the source region 34 through the weakly-inverted vertical portion 68 of the channel region 66. As the electrons reach the horizontal portion 70 of the channel region 66, they will see the high potential of the near end of floating gate 14 (because the floating gate 14 is more strongly capacitively coupled to the positively charged source region 34 than to the control gate 44). The electrons will accelerate and become heated, with most of them being injected into and through the insulating layer 12 and onto the floating gate 14. Ground potential and Vdd (approximately 1.5 to 3.3 volts depending upon the power supply voltage of the device) are applied to the source lines 34 and bit-lines 40, respectively, for memory cell columns not containing the selected memory cell 64, as well as to the control gates 44 for memory cell rows not containing the selected memory cell 64. Thus, only the memory cell 64 in the selected row and column is programmed.

The injection of electrons onto the floating gate 14 will continue until the reduction of the charge on the near end of the floating gate 14 can no longer sustain a high surface potential along the horizontal channel region portion 70 to generate hot electrons. At that point, the electrons or the negative charges in the floating gate 14 will decrease the electron flow from the drain region 40 onto the floating gate 14.

Finally, to read a selected memory cell 64, ground potential is applied to its source region 34. A read voltage of approximately +1 volt is applied to its drain region 40 and approximately 1.5 to 3.3 volts (depending upon the power supply voltage of the device) is applied to its control gate 44. If the floating gate 14 is positively charged (i.e. the floating gate is discharged of electrons), then the horizontal portion 70 of the channel region 66 (directly underneath the floating gate 14) is turned on. When the control gate 44 is raised to the read potential, the vertical portion 68 of the channel region 66 (directly adjacent the control gate 44) is also turned on. Thus, the entire channel region 66 will be turned on, causing electrical current to flow from the source regions 34 to the drain region 40. This would be the "1" state.

On the other hand, if the floating gate 14 is negatively charged, the horizontal portion 70 of the channel region 66 (directly below the floating gate 14) is either weakly turned on or is entirely shut off. Even when the control gate 44 and the drain region 40 are raised to the read potential, little or no current will flow through horizontal portion 70 of channel region 66. In this case, either the current is very small compared to that of the "1" state or there is no current at all. In this manner, the memory cell 64 is sensed to be programmed at the "0" state. Ground potential is applied to the source lines 34, bit-lines 40, and control gates 44 for non-selected columns and rows so only the selected memory cell 64 is read.

The memory cell array includes peripheral circuitry including conventional row address decoding circuitry, column address decoding circuitry, sense amplifier circuitry, output buffer circuitry and input buffer circuitry, which are well known in the art.

The present invention provides a memory cell array with reduced size and superior program efficiency. Memory cell size is reduced by as much as almost 50% because the bit line region 40 is buried inside the substrate 10, and the bit line regions 40 are self aligned to the second trenches, where space is not wasted due to limitations in the lithography generation, contact alignment and contact integrity. Cell areas of approximately 0.21 $\mu$m and 0.14 $\mu$m can be achieved by the present invention using 0.18 $\mu$m and 0.13 $\mu$m technology generations, respectively. Program efficiency is greatly enhanced by "aiming" the vertical portion 68 of the channel region 66 at the floating gate 14. In conventional programming schemes, the electrons in the channel region flow in a path parallel to the floating gate, where a relatively small number of the electrons become heated and are injected onto the floating gate. The estimated program efficiency (number of electrons injected compared to total number of electrons) is estimated at about 1/1000. However, because the first portion of the channel region defines an electron path that is 'aimed' directly at the floating gate, the program efficiency of the present invention is estimated to be closer to 1/1, where almost all the electrons are injected onto the floating gate.

Also with the present invention, the control gate region formed in the side-wall of the trenches 38 can be separately optimized for conduction performance as well as punch-through immunity without affecting cell size. Additionally, the punch-through suppression between source region 34 and the buried bit-line region 40 can be optimized by embedding the source region having a first conductivity type (e.g. N type) in a well having a second conductivity type (e.g. P type) different from the first conductivity type, along with using other sub-surface implant(s) that do not affect the conduction characteristics of the memory cell. Furthermore, having source region 34 and bit-line region 40 separated vertically as well as horizontally allows easier optimization of reliability parameters without affecting cell size.

First Alternate Embodiment

Figure 6A:
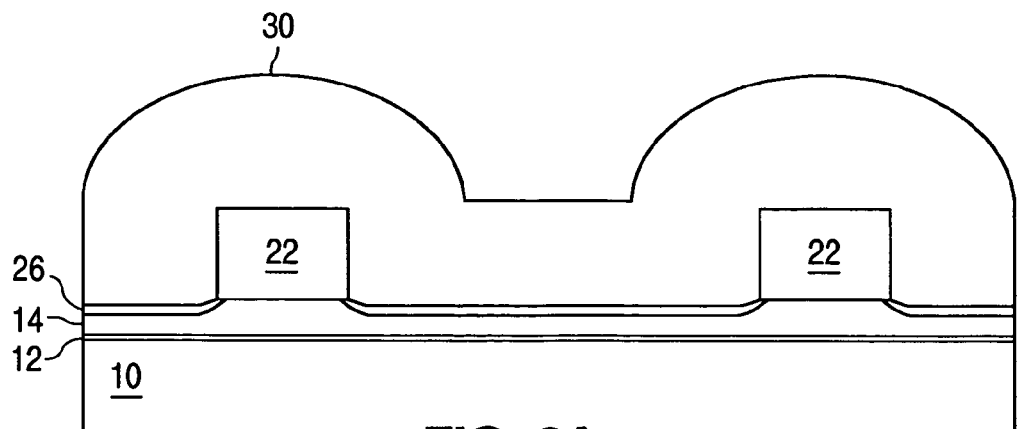
FIGS. 6A–6K are cross sectional views of a semiconductor structure showing in sequence the steps in a first alternate processing of the semiconductor structure of FIG. 1C in the formation of a non volatile memory array of floating memory cells of the present invention.
Figure 6B:
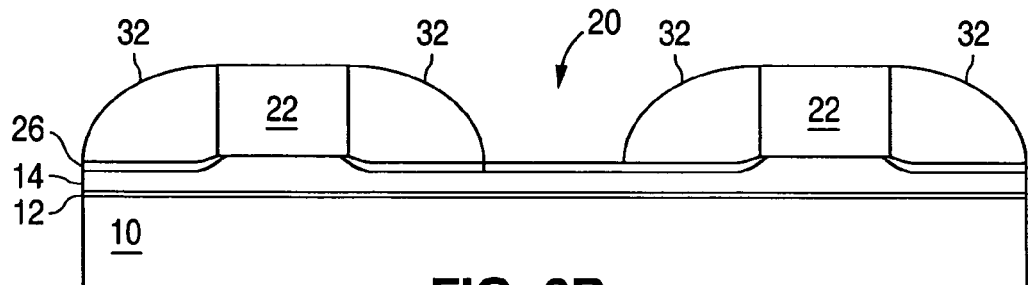

FIGS. 6A to 6K illustrate an alternate process for forming the memory cell structure similar to that illustrated in FIG. 4. This alternate process begins with the same structure as shown in FIG. 1C, except that the formation of the thin layer of nitride 28 is omitted. Instead, the deposition of the thick layer 30 of oxide is performed directly over nitride blocks 22 and oxide layer 26 (~2500 A), as shown in FIG. 6A. An anisotropic etch process (e.g. RIE) is used to remove the deposited oxide layer 30, except for spacers 32, as shown in FIG. 6B. This etch process uses the poly layer 14 as an etch stop, and therefore a portion of the oxide layer 26 at the center bottom of first trenches 20 is also removed.

Figure 6C:
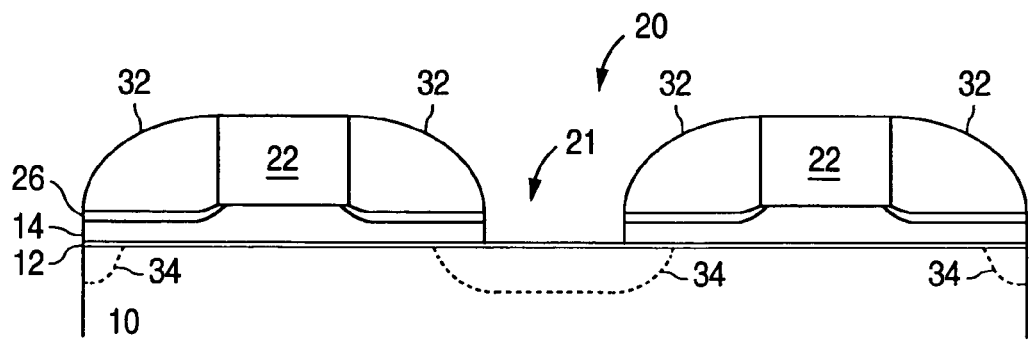
Figure 6D:
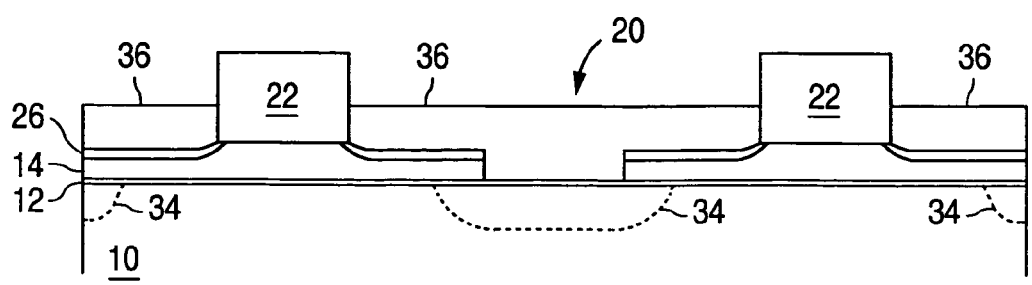

Narrower lower portions 21 of first trenches 20 are formed by a poly etch step that is used to remove the exposed portions of poly layer 14 between spacers 32 to expose oxide layer 12 at the bottom of each of the first trenches 20. Suitable ion implantation is then made across the entire surface of the structure. Where the ions have sufficient energy to penetrate exposed portions of oxide layer 12 in each first trench 20, they then form first regions (source line regions) 34 in the substrate 10. In all other regions, the ions are absorbed by the underlying structure, where they have no effect. The implanted source regions 34 are formed in parallel lines that are self aligned to the lower portions 21 of first trenches 20. A mask (not shown) should be used along the edges of the array to block the implantation of regions 34 and prevent adjacent source regions 34 from being shorted together. The resulting structure is shown in FIG. 6C.

A thick oxide layer 36 is deposited over the structure, followed by a planarization oxide etch process (e.g. Chemical-Mechanical-Polishing or CMP etch) that etches the thick oxide layer 36 down to the tops of nitride blocks 22, which are used as the etch stop. Oxide layer 36 is further etched below the tops of nitride blocks 22, resulting in the structure shown in FIG. 6D.

Figure 6E:
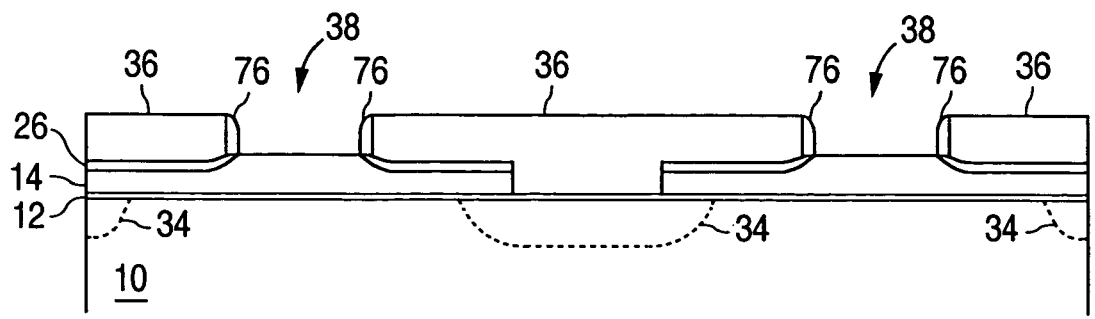
Figure 6F:
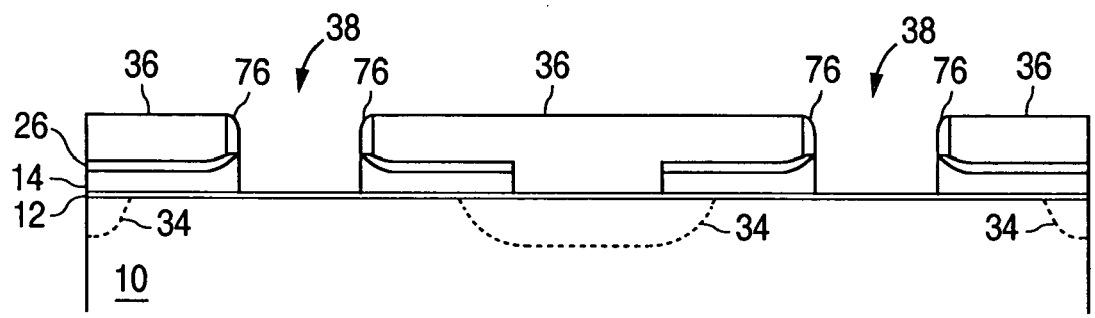

A nitride etch process is used to remove nitride blocks 22 and form second trenches 38 that extend down to poly layer 14. Nitride spacers 76 are then formed on sidewalls of the second trenches 38 by depositing a layer of nitride (~200–400 A) over the structure, followed by a nitride etch that removes the deposited nitride except for nitride spacers 76, as shown in FIG. 6E. A poly etch step is then used to remove portions of poly layer 14 exposed between spacers 76, which extends second trenches 38 down to oxide layer 12. The resulting structure is shown in FIG. 6F.

Figure 6G:
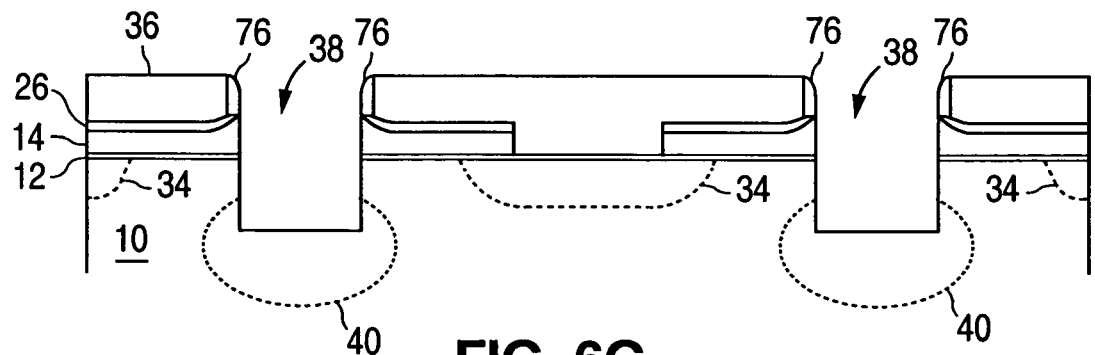

Exposed portions of oxide layer 12 at the bottom of second trenches 38 are removed by an oxide etch process, leaving portions of the substrate 10 between spacers 76 exposed. A silicon etch process is used to extend second trenches 38 down into the substrate 10, preferably to a depth of 0.2 µm. Suitable ion implantation is made across the entire surface of the structure. The ion implantation forms second regions 40 (buried bit-line regions) in the substrate 10 underneath second trenches 38. Outside of second trenches 38, the ions are blocked by the dielectric oxide layer 36, where they have no effect. The resulting structure is shown in FIG. 6G.

Figure 6H:
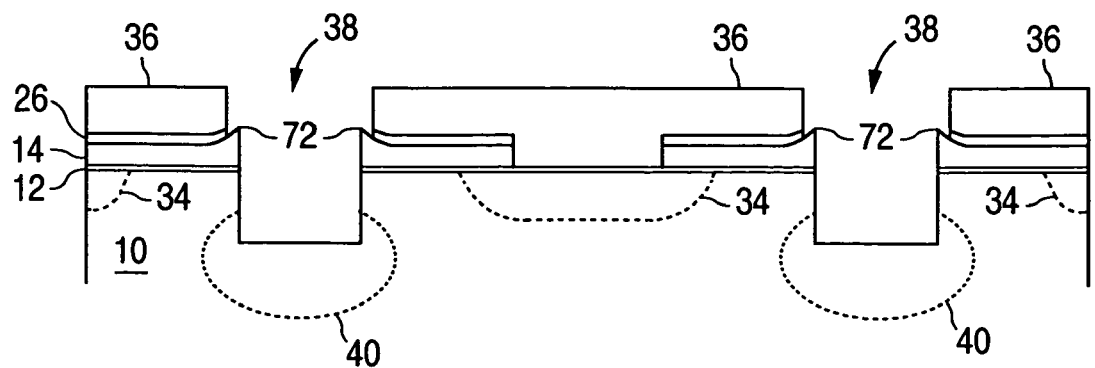
Figure 6I:
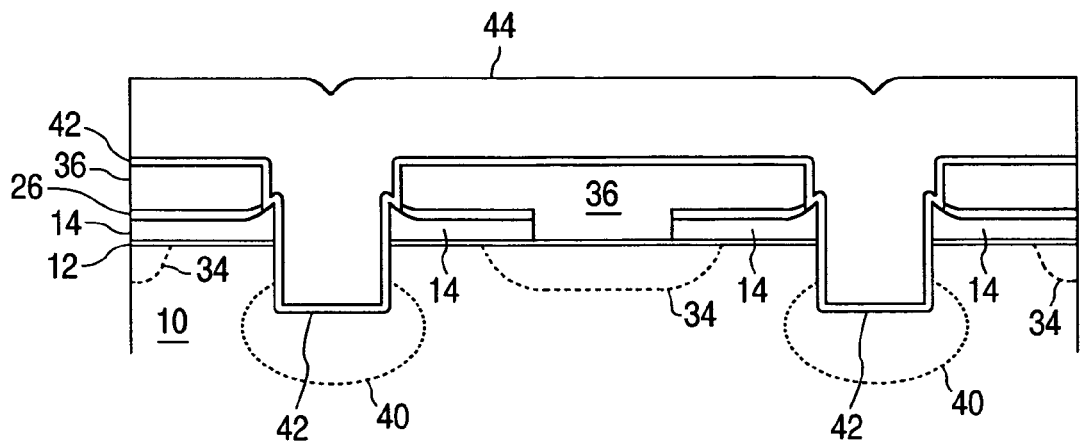

A nitride etch is used to remove nitride spacers 76, which leaves the ends of oxide layer 26 exposed. A controlled oxide etch is then used to remove the exposed ends of oxide layer 26, leaving the sharp edges 72 of the floating gates 14 exposed, as shown in FIG. 6H. A thin layer of oxide 42 is then formed over the entire structure, including inside second trenches 38 and over floating gate sharp edges 72, using for example an HTO oxide deposition process. A thick poly layer 44 (~0.18 µm) is then deposited over the oxide layer 42, including filling second trenches 38. Poly layer 44 can be doped by ion implant, or by an in-situ process. An optional layer (not shown) of metalized silicon (polycide) can be formed on top of poly layer 44 by depositing a metal such as tungsten, cobalt, titanium, nickel, platinum, or molybdenum over the structure, and then annealing the structure to permit the hot metal to flow and to seep into the top portion of poly layer 44 to form the conductive layer of polycide. The resulting structure is shown in FIG. 6I.

A photo-resistant material is applied to the structure, and a masking step is performed to selectively remove the photo-resistant material from parallel stripe regions 46 (see FIG. 1L). This masking step defines alternating parallel active (word line) regions 48 (in which active memory cells are formed) and inactive regions 46 (in which no active memory cells will be formed). A series of etch processes are then performed, which do not affect the active regions 48 (which are protected by the photo-resistant material). First, a (dry) poly etch is performed to remove the exposed poly layer 44 outside of second trenches 38 in the inactive regions 46, using oxide layer 42 as an etch stop. An oxide etch is then performed to remove exposed portions of the oxide layers 42, 36 and 26, using the poly layer 14 as an etch stop. A poly etch follows, which removes the poly layer 14 and the remaining poly layer 44 inside of second trenches 38. The photo-resistant material in the active regions 48 is then removed. The active regions 48 remain unchanged from the structure shown in FIG. 6I, while the resulting structure in the inactive regions 46 is the same as that illustrated in FIG. 1M.

Figure 6J:
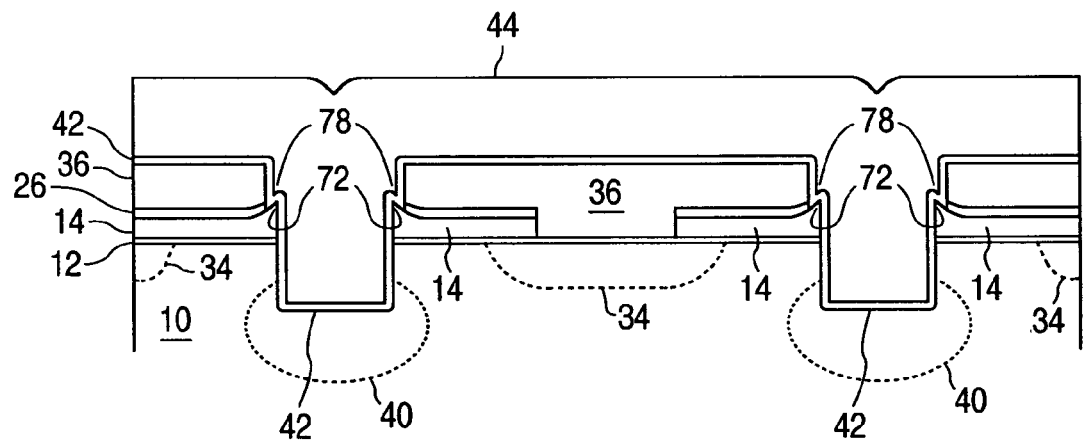
Figure 6K:
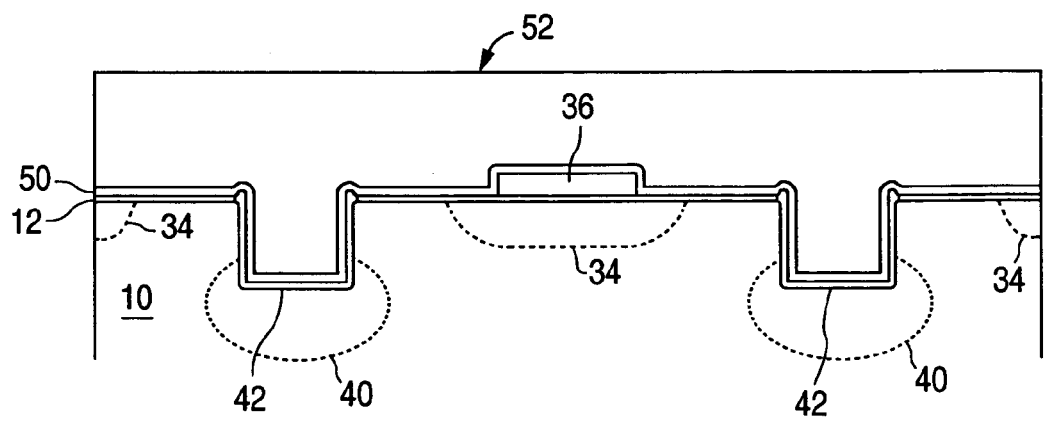

A thin layer of oxide 50 is formed over the structure (e.g. thermally grown, HTO, or CVD deposit), followed by the deposition of a thick layer of oxide 52 over the structure which fills second trenches 38 in the inactive regions 46. A planarizing oxide etch (e.g. CMP) is then used to level out oxide layer 52. An oxide etch follows to fully expose the poly layer 44 in the active regions 48. The resulting structure in the active regions 48 is shown in FIG. 6J (which is unchanged from FIG. 6I), and the structure in the inactive regions 46 is shown in FIG. 6K.

This first alternate embodiment has the advantage of providing an additional thick oxide layer 36 between the floating gate 14 and the horizontal portion of the control gate 44, which suppresses the coupling capacitance therebetween. This reduced coupling capacitance enhances both the erase operation and the program operation. This embodiment also forms an optional overhang portion 78 on the control gates that better overhangs the sharp edges 72 of the floating gate 14 for better tunneling during the erase operation.

Second Alternate Embodiment

Figure 7A:
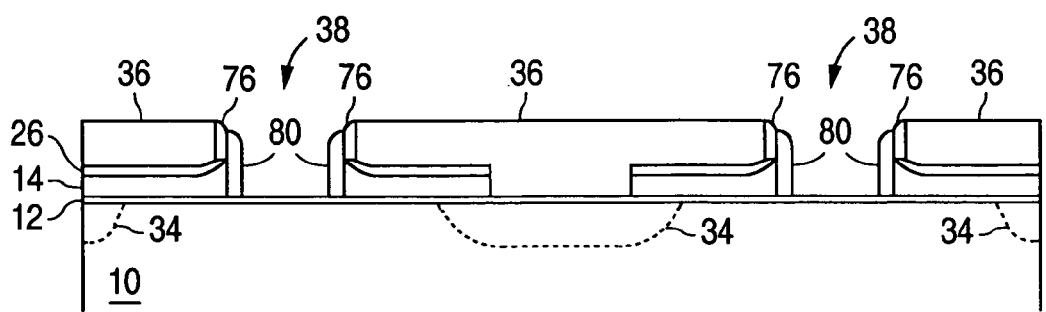
FIGS. 7A–7D are cross sectional views of a semiconductor structure showing in sequence the steps in a second alternate processing of the semiconductor structure of FIG. 6F in the formation of a non volatile memory array of floating memory cells of the present invention.

FIGS. 7A to 7D illustrate a second alternate process for forming the memory cell structure similar to that illustrated in FIG. 4. This alternate process begins with the same structure as shown in FIG. 6F, except that second nitride spacers 80 are formed inside second trenches 38, by depositing a thick layer of nitride (~400–600 Å) followed by a dry nitride etch. The resulting structure is shown in FIG. 7A.

Figure 7B:
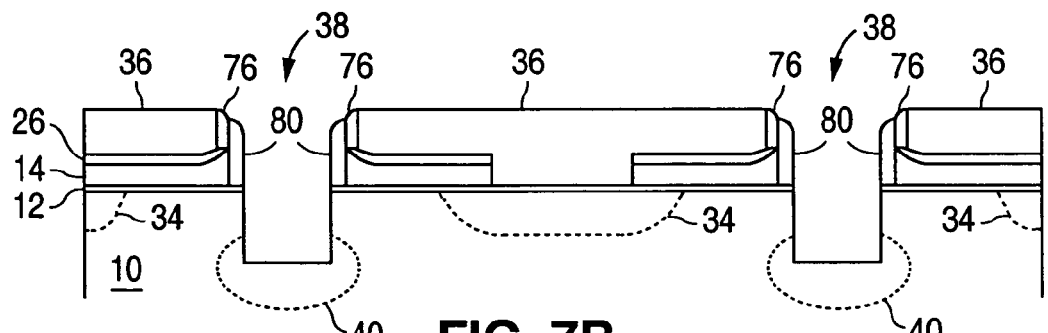

Exposed portions of oxide layer 12 at the bottom of second trenches 38 are removed by an oxide etch process, leaving portions of the substrate 10 between spacers 80 exposed. A silicon etch process is used to extend second trenches 38 down into the substrate 10, preferably to a depth of 0.2 µm. Suitable ion implantation is made across the entire surface of the structure. The ion implantation forms second regions 40 (buried bit-line regions) in the substrate 10 underneath second trenches 38. Outside of second trenches 38, the ions are blocked by the dielectric oxide layer 36, where they have no effect. The resulting structure is shown in FIG. 7B.

Figure 7C:
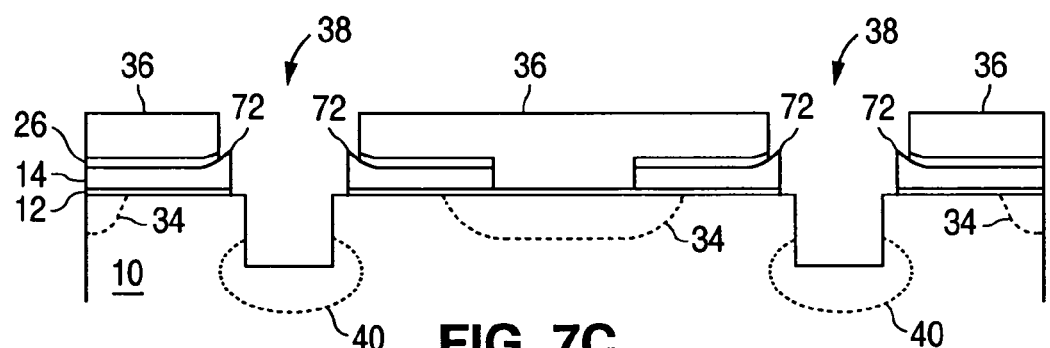

A nitride etch is used to remove nitride spacers 76 and 80, which leaves the ends of oxide layer 26 exposed. A controlled oxide etch is then used to remove the exposed ends of oxide layer 26, leaving the sharp edges 72 of the floating gates 14 exposed, as shown in FIG. 7C. This oxide etch also removes the exposed portions of oxide layer 12 that were underneath nitride spacers 80.

Figure 7D:
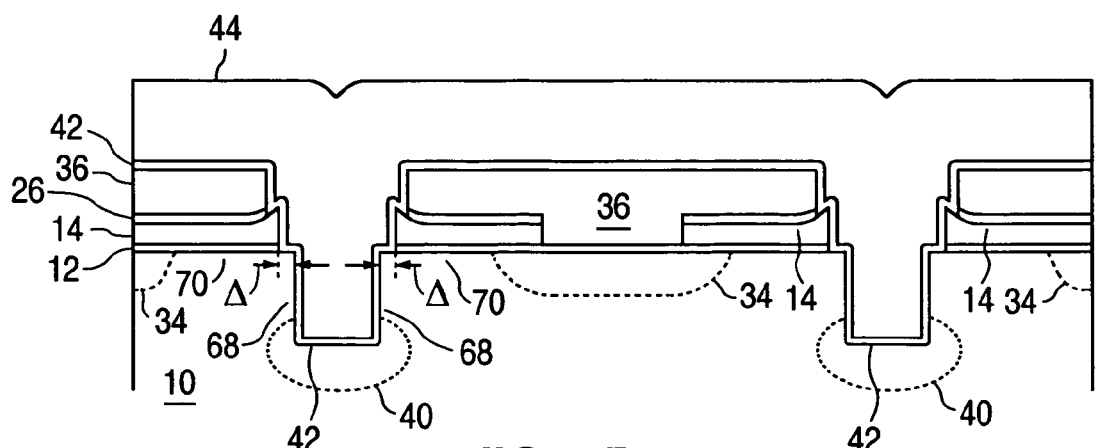

A thin layer of oxide 42 is then formed over the entire structure, including inside second trenches 38 and over floating gate sharp edges 72, using for example an HTO oxide deposition process. A thick poly layer 44 (~0.18 µm) is then deposited over the oxide layer 42, including filling second trenches 38. Poly layer 44 can be doped by ion implant, or by an in-situ process. An optional layer (not shown) of metalized silicon (polycide) can be formed on top of poly layer 44 by depositing a metal such as tungsten, cobalt, titanium, nickel, platinum, or molybdenum over the structure, and then annealing the structure to permit the hot metal to flow and to seep into the top portion of poly layer 44 to form the conductive layer of polycide. The resulting structure is shown in FIG. 7D. The processing of the structure is then completed using the remaining steps as described with the respect to FIGS. 6J and 6K.

This second alternate embodiment has the further advantage of providing an offset Δ between the edges of the second trenches 38 in the substrate and the edges of the floating gate 14. This offset Δ causes part of the control gate 44 to overlap a first part of the horizontal portion 70 of the channel region 66, while the floating gate overlaps the remaining (second) part of the channel regions second part. Thus, with this embodiment, the vertical portion 68 is not 'aimed' at the floating gate. Rather, this embodiment bridges a buried bit line region 40 with conventional hot electron programming, where the electrons in the channel region flow parallel to the floating gate for hot electron injection. Further, this embodiment is more immune to program disturbance during cell operation, because the electrons are not 'aimed' at the floating gate during a low voltage read operation, or when the memory cell is not selected during a program operation, and are therefore less likely to inadvertently be injected onto the floating gate.

Third Alternate Embodiment

Figure 8A:
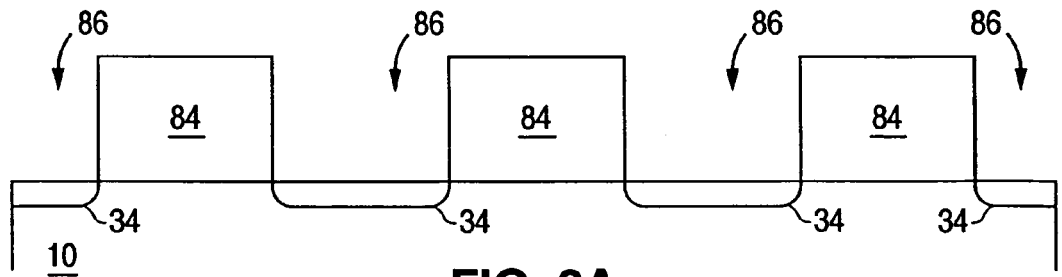
FIGS. 8A–8N are cross sectional views of a semiconductor structure showing in sequence the steps in a third alternate processing of the semiconductor substrate in the formation of a non volatile memory array of floating memory cells of the present invention.

FIGS. 8A to 8N illustrate a third alternate process for forming the memory cell structure of the present invention. This process starts by forming a layer of insulation material 84 (such as nitride) on the substrate 10. A plurality of parallel trenches 86 are formed in the nitride layer 84 by applying a photo-resistant material and performing a masking step to remove the photo-resistant material from selected parallel stripe regions. An anisotropic nitride etch is used to remove the exposed portions of nitride layer 84 in the stripe regions, leaving trenches 86 that extend down to the substrate 10, as shown in FIG. 8A. Suitable ion implantation is then made across the surface of the structure to form the first regions (source regions) 34 in the substrate, formed in parallel lines that are self aligned to the trenches 86. The resulting structure is shown in FIG. 8A, with trenches 86 defined between blocks of the nitride 84.

Figure 8B:
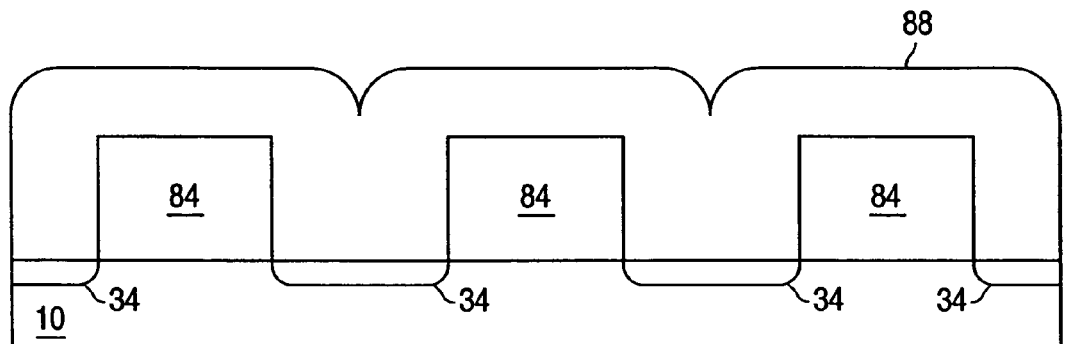
Figure 8C:
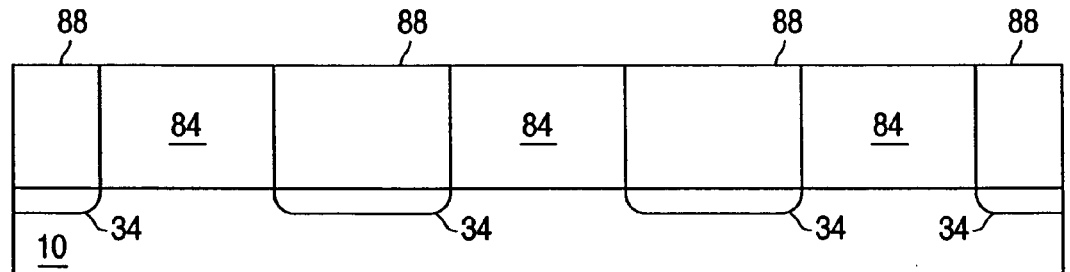

A layer of polysilicon 88 is then deposited over the structure, which fills trenches 86, as shown in FIG. 8B. A planarization poly etch process (e.g. CMP) is used to etch the poly layer 88 down even with the tops of nitride blocks 84, which are used as the etch stop. The resulting structure is shown in FIG. 8C, where blocks 88 of polysilicon are separated by blocks 84 of nitride.

Figure 8D:
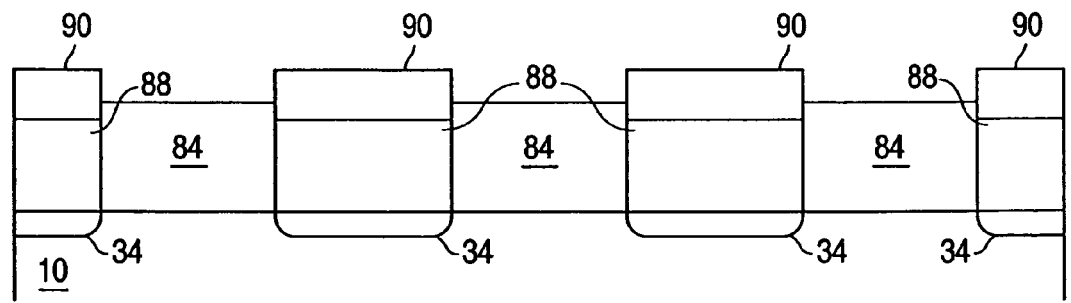
Figure 8E:
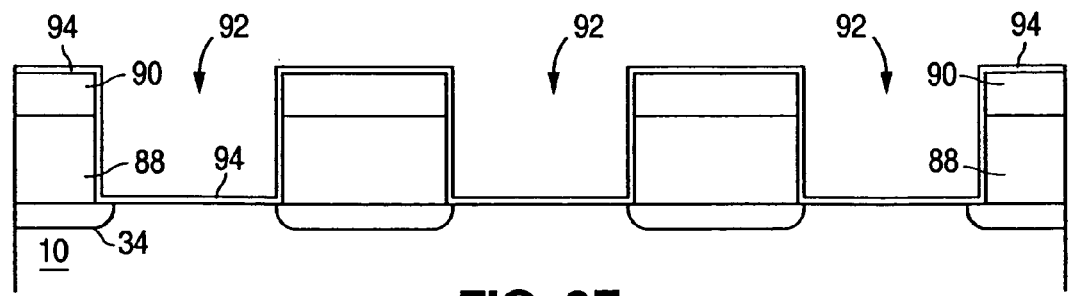

The structure is then subjected to an oxidation process, which forms a layer of oxide 90 on the exposed top surfaces of poly blocks 88, as illustrated in FIG. 8D. A nitride etch process is then used to remove nitride blocks 84, leaving second trenches 92 defined between poly blocks 88 and extending down to the substrate 10. A linear oxidation process follows (e.g. HTO oxide deposition), which forms a thin layer of oxide 94 over the structure, including inside second trenches 92. The resulting structure is shown in FIG. 8E.

Figure 8F:
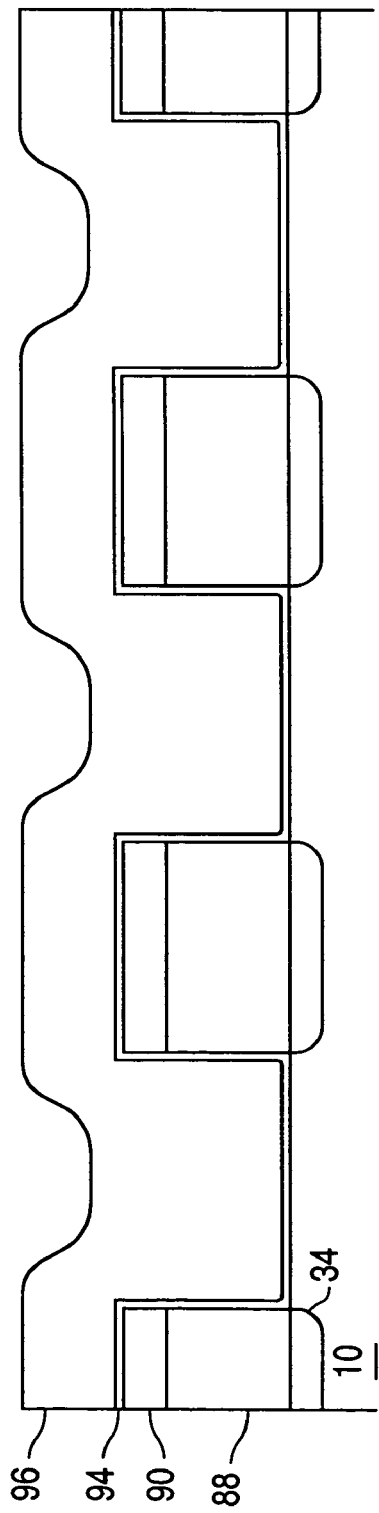
Figure 8G:
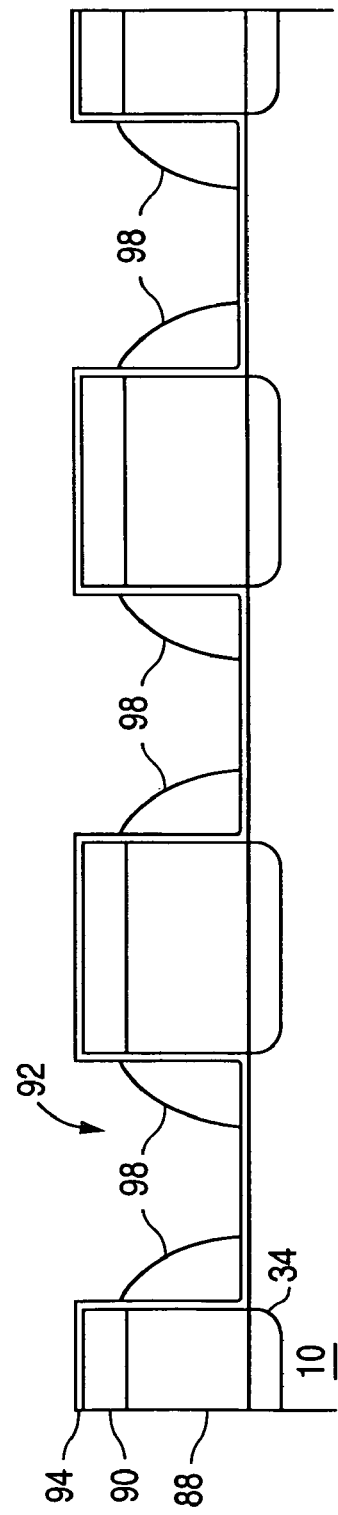
Figure 8H:
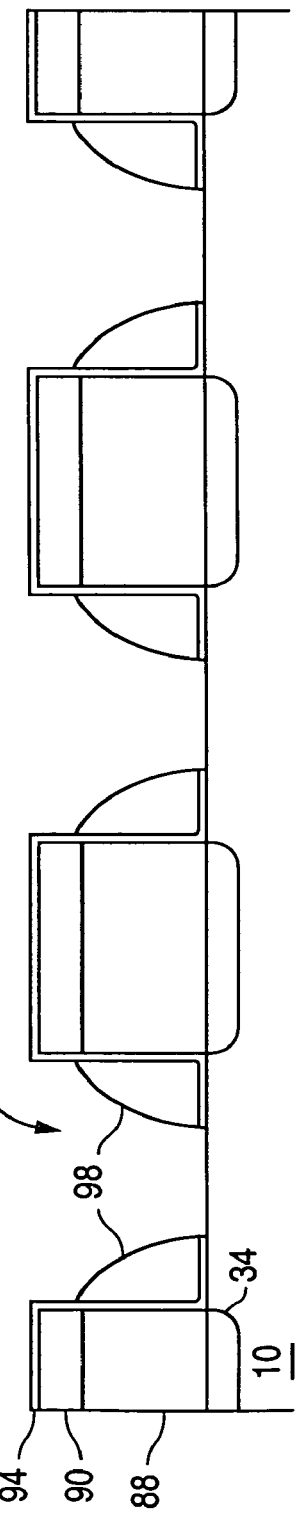

A thick layer of material (e.g. nitride) 96 is deposited over the structure (see FIG. 8F), followed by an anisotropic nitride etch process that removes the nitride 96 except for nitride spacers 98 disposed against the sidewalls of the second trenches 92 (see FIG. 8G). An oxide etch is then performed to remove the exposed portions of oxide layer 94 at the bottom of second trenches 92, leaving portions of the substrate 10 exposed. The resulting structure is shown in FIG. 8H. It should be noted that oxide could instead be used as insulation material 96, in which case the oxide etch process after spacer formation would not be necessary.

A silicon etch process is used to remove portions of substrate 10 left exposed at the bottom of second trenches 92 and in-between nitride spacers 98. This etch process extends second trenches 92 down into the substrate 10 (preferably down to a depth of approximately one feature size deep, i.e. in 0.15 um technology, trenches 92 are about 0.15 um deep), where lower portions 92a of second trenches 92 in substrate 10 have a width corresponding to the separation of nitride spacers 98 in upper portions 92b of second trenches 92 above substrate 10. Suitable ion implantation is once again made across the entire surface of the structure. The ion implantation forms the second regions 40 (buried bit-line regions) in the substrate 10 underneath second trenches 92. The resulting structure is shown in FIG. 8I.

A nitride etch is used to remove nitride spacers 98. An optional oxide etch and oxidation process can be used to remove oxide layer 94, and re-form it on exposed portions of poly blocks 88 and substrate 10 with a different but desired thickness. A thick poly layer 100 is deposited over the structure which fills second trenches 92, as shown in FIG. 8J. Poly layer 100 can be doped by ion implant, or by in-situ process. A poly etch follows, which removes poly layer 100 except for poly spacers 102 in the second trench upper portions 92b, as shown in FIG. 8K. There may be some residual polysilicon 104 left at the bottom of second trenches 92, which serve no constructive purpose for the formation or operation of the memory cells.

An oxidation process is used to form an oxide layer 106 on the exposed surfaces of the poly spacers 102. As described later, oxide layer 106 has a thickness that permits Fowler-Nordheim tunneling therethrough. This oxidation process also encapsulates any of the residual polysilicon 104 within oxide. Depending upon the coupling ratio with poly spacers 102 (which form the floating gates of the memory cells), an optional oxide etch step could precede the formation of oxide layer 106 to remove the oxide layers 94 and 90 over poly blocks 88 and in trenches 92, wherein the oxidation process used to form oxide layer 106 would also form an oxide layer over poly blocks 88 and in trenches 92. A thick poly layer 108 is then deposited over the structure, which fills second trenches 92 and extends over (and is insulated from) poly spacers 102 and poly blocks 88. The resulting structure is shown in FIG. 8L.

Thus far, the structure shown in FIG. 8L was formed with one masking step, with second trenches 92 extending in a first direction. Parallel active and inactive stripe regions, that extend across and are perpendicular to the first direction of the second trenches 92, are formed in the same manner as described above with respect to FIG. 1K (namely masking step to define alternating parallel active (word line) regions 48 and inactive regions 46, poly and oxide etches to remove poly layer 108, oxide layers 90/94, and poly spacers 102 from the inactive regions 46). After the photo-resistant material in the active regions 48 is removed, a thick oxide deposition step covers both the active and inactive regions with a thick oxide layer 110. An oxide CMP planarization process is used to planarize the top surface of the oxide layer 110. The final active region structure is illustrated in FIG. 8M, and the final inactive regions structure is illustrated in FIG. 8N.

Figure 9:
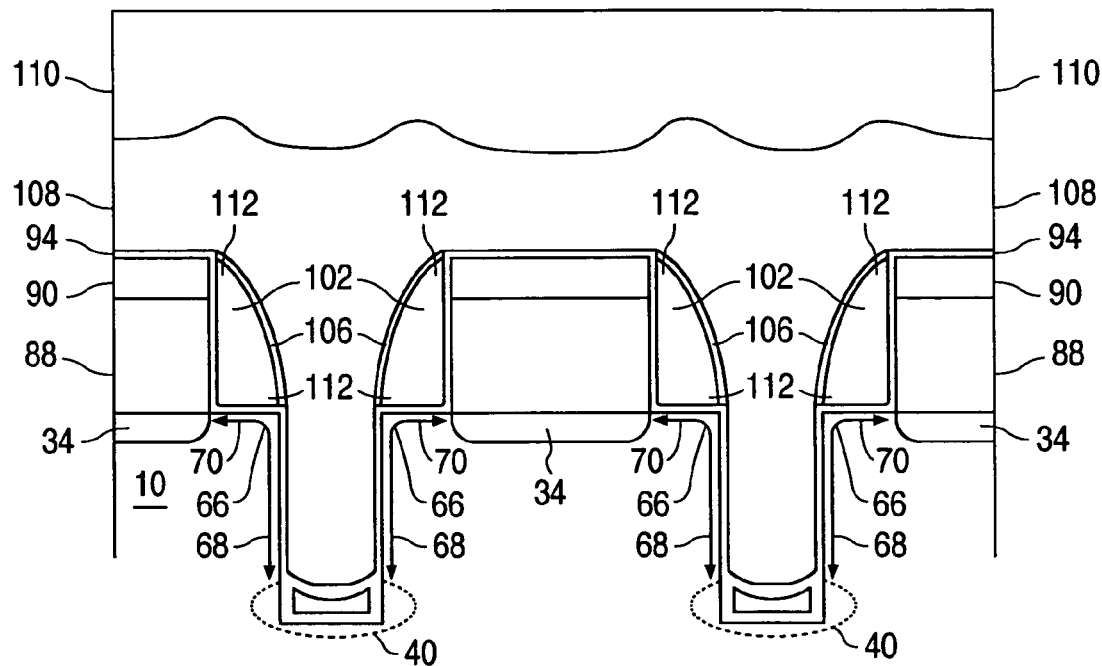
FIG. 9 is a cross sectional view of the active regions of the third alternate embodiment showing the memory cell structure of the present invention.

FIG. 9 illustrates the final structure of the memory cells formed by this third alternate embodiment in the active regions 48. First and second regions 34/40 form the source and drain for each cell (although those skilled in the art know that source and drain can be switched during operation). Poly spacers 102 constitutes the floating gates, and the portions of poly layer 108 disposed in second trenches 92 and over floating gates 102 constitute the control gates for each of the memory cells. The channel region 66 for each memory cell is the surface portion of the substrate that is in-between the source and drain 34/40. The channel region 66 for each memory cell has two portions joined together at a right angle, with the vertical portion 68 extending along the vertical wall of second trench 92 and a horizontal portion 70 extending between the second trench 92 and the source region 34. The floating gate 102 is disposed directly over, but insulated from, the horizontal portion 70 of the channel region 66. As illustrated in the FIG. 9, the process of the present invention forms pairs of memory cells that mirror each other, with a memory cell formed on each side of the second trenches 92 that share a common bit-line region 40. Similarly, each source line region 34 is shared between adjacent memory cells from different mirror sets of memory cells. The entire row of memory cells shares a single poly layer 108 that acts as the control gate for all the memory cells in that row.

The memory cell structure shown in FIG. 9 includes "a raised source line" 88, meaning that the conductive poly block 88 runs along (and is electrically connected to) the source line 34, but is disposed above the substrate surface. The raised source lines 88 have sidewalls that are disposed laterally adjacent to sidewalls of floating gates 102, but are insulated therefrom by oxide layer 94. This configuration provides capacitive coupling between the raised source lines 88 and floating gates 102 (without the need to overlap the floating gates with the source regions 34, thus reducing the size of the memory cells). The floating gates 102 each have sharp edges 112 that face toward the control gate poly 108 for enhancing the electric field therebetween. With this third alternate embodiment, the poly blocks 88 are self aligned to the source regions 34, and the floating gates 102 are self aligned between the poly blocks 88 and the control gate poly 108 (and thus are self aligned to the first and second portions 68/70 of the channel region 66).

Figure 10:
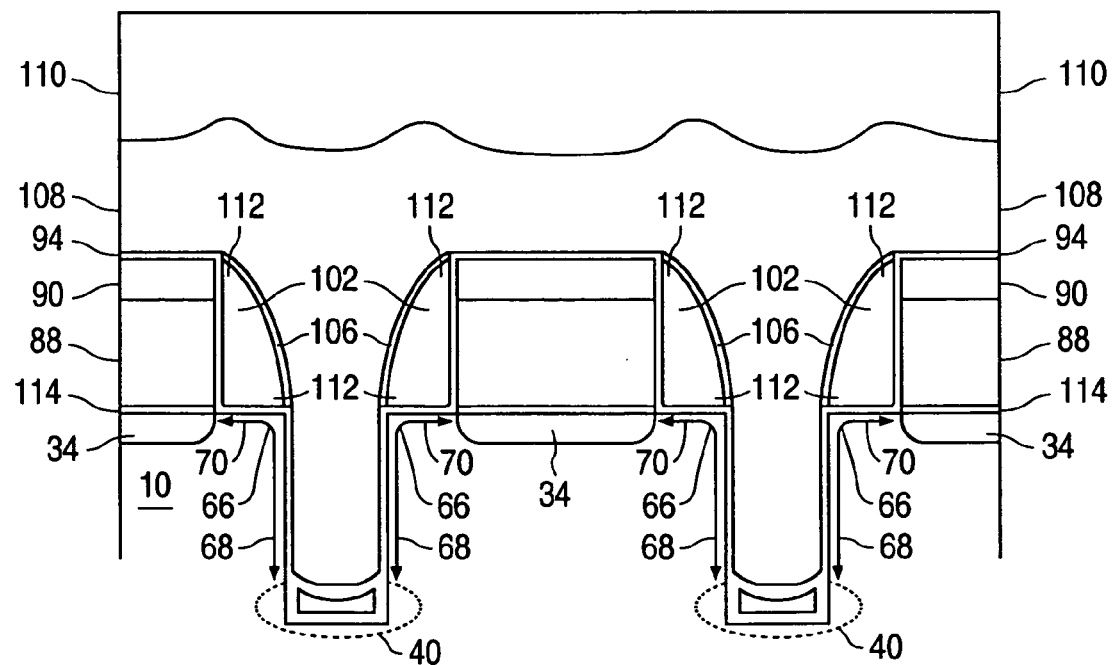
FIG. 10 is a cross sectional view of the active regions of the third alternate embodiment that includes an oxide layer insulating the poly blocks 88 from the source regions 34.

It should be noted that capacitive coupling between the raised source line 88 and the adjacent floating gates 102 can be enhanced by forming a layer of insulation material between the raised source lines 88 and the source regions 34. For example, an oxidation step can be performed to form an oxide layer 114 on the substrate surface before the poly layer 88 is deposited (in FIG. 8B), which results in the final structure illustrated in FIG. 10. With poly block 88 insulated from source region 34 by oxide layer 114, a voltage can be applied to poly block 88 independent of source region 34. Thus, poly block 88 can be raised to a higher voltage than that of the source region 34 to better capacitively couple a higher voltage to the adjacent floating gates 102 during the programming operation, and a negative voltage can be applied to the poly block 88 to enable a more efficient erase operation.

It is to be understood that the present invention is not limited to the embodiments described above and illustrated herein, but encompasses any and all variations falling within the scope of the appended claims. For example, second trenches can end up having any shape that extends into the substrate, not just the elongated rectangular shape shown in the figures. Also, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate too, which are regions that are doped to have a different conductivity type compared to other portions of the substrate. Lastly, single layers of insulating or conductive material could be formed as multiple layers of such materials, and vice versa.

What is claimed is:

1. An electrically programmable and erasable memory device comprising:

a substrate of semiconductor material of a first conductivity type;

a trench formed into a surface of the substrate;

first and second spaced-apart regions formed in the substrate and having a second conductivity type, with a channel region formed in the substrate therebetween, wherein the second region is formed underneath the trench, and the channel region includes a first portion that extends substantially along a sidewall of the trench and a second portion that extends substantially along the surface of the substrate;

a block of conductive material disposed over the first region;

an electrically conductive floating gate disposed over and insulated from at least a portion of the channel region, and disposed laterally adjacent to and insulated from the block of conductive material; and an electrically conductive control gate having a first portion disposed in the trench.

2. The device of claim 1, wherein the control gate has a second portion disposed over and insulated from the floating gate.

3. The device of claim 2, further comprising:
a layer of insulating material formed along sidewalls of the trench and extending between the control gate and the floating gate.

4. The device of claim 3, wherein the layer of insulating material includes:
a first portion formed along sidewalls of the trench and between the control gate and the channel region first portion; and
a second portion formed under the control gate and over the floating gate.

5. The device of claim 1, wherein the floating gate is a spacer.

6. The device of claim 5, wherein the floating gate includes at least one sharp edge that extends toward the control gate.

7. The device of claim 1, wherein the floating gate is disposed substantially over the entire second portion of the channel region.

8. The device of claim 1, wherein the floating gate is insulated from the control gate by an insulation layer having a thickness permitting Fowler-Nordheim tunneling of charges therethrough.

9. The device of claim 1, wherein the channel region first portion extends in a direction directly toward the floating gate.

10. The device of claim 1, wherein the first region is electrically connected with the block of conductive material.

11. An electrically programmable and erasable memory device comprising:
a substrate of semiconductor material of a first conductivity type;
a trench formed into a surface of the substrate;
first and second spaced-apart regions formed in the substrate and having a second conductivity type, with a channel region formed in the substrate therebetween, wherein the second region is formed underneath the trench, and the channel region includes a first portion that extends substantially along a sidewall of the trench and a second portion that extends substantially along the surface of the substrate;
a block of conductive material disposed over the first region;
an electrically conductive floating gate disposed over and insulated from at least a portion of the channel region, and disposed laterally adjacent to and insulated from the block of conductive material;
an electrically conductive control gate having a first portion disposed in the trench; and
a layer of insulation material disposed between the first region and the block of conductive material, wherein the insulation material electrically insulates the first region from the block of conductive material.

12. An array of electrically programmable and erasable memory devices comprising:
a substrate of semiconductor material of a first conductivity type;
spaced apart isolation regions formed on the substrate which are substantially parallel to one another and extend in a first direction, with an active region between each pair of adjacent isolation regions;
a plurality of trenches formed into a surface of the substrate which are substantially parallel to one another and extend across the isolation and active regions in a second direction that is substantially perpendicular to the first direction;
each of the active regions including a plurality of memory cells, each of the memory cells comprising:
first and second spaced-apart regions formed in the substrate having a second conductivity type, with a channel region formed in the substrate therebetween, wherein the second region is formed underneath one of the trenches, and wherein the channel region has a first portion extending substantially along a sidewall of the one trench and a second portion extending substantially along the surface of the substrate,
a block of conductive material disposed over the first region, and
an electrically conductive floating gate disposed over and insulated from at least a portion of the channel region, and disposed laterally adjacent to and insulated from the block of conductive material; and
a plurality of electrically conductive control gates each extending along one of the active regions, wherein the control gates each have first portions disposed in the trenches.

13. The array of claim 12, wherein the control gates each have second portions disposed over and insulated from the floating gates.

14. The array of claim 13, wherein each of the memory cells further comprises a layer of insulating material formed along sidewalls of the trench and extending between the control gate and the floating gate.

15. The array of claim 14, wherein the layer of insulating material for each memory cell includes:
a first portion formed along sidewalls of the trench and between the control gate and the channel region first portion; and
a second portion formed under the control gate and over the floating gate.

16. The array of claim 12, wherein the floating gates are spacers.

17. The array of claim 16, wherein the floating gates each include at least one sharp edge that extends toward one of the control gates.

18. The array of claim 12, further comprising:
a layer of isolation material extending along each of the isolation regions and filling portions of the trenches that are in the isolation regions.

19. The array of claim 18, wherein the isolation material layer in each of the isolation regions is disposed between a pair of the control gates in adjacent active regions.

20. The array of claim 12, wherein for each of the memory cells, the floating gate is disposed substantially over the entire second portion of the channel region.

21. The array of claim 12, wherein for each of the memory cells, the floating gate is insulated from the control gate by an insulation layer having a thickness permitting Fowler-Nordheim tunneling of charges therethrough.

22. The array of claim 12, further comprising a plurality of conductive contacts each electrically connected to one of the first regions.

23. The array of claim 12, further comprising a plurality of conductive contacts each electrically connected to one of the second regions.

24. The array of claim 12, wherein each of the channel region first portions extend in a direction directly toward one of the floating gates.

25. The array of claim 12, wherein the memory cells are formed as pairs of memory cells, and wherein each of the memory cell pairs share a single second region therebetween.

26. The array of claim 12, wherein the memory cells are formed as pairs of memory cells, and wherein each of the memory cell pairs share a single first region therebetween.

27. The array of claim 12, wherein for each of the memory cells, the first region is electrically connected with the block of conductive material.

28. The array of claim 12, wherein each of the memory cells further comprises:
   a layer of insulation material disposed between the first region and the block of conductive material, wherein the insulation material electrically insulates the first region from the block of conductive material.

29. The array of claim 12 wherein the second regions are integrally formed together in one of a plurality of conductive lines buried in the substrate, and wherein each of the conductive lines extends in the second direction and includes a raised portion that extends up to the substrate surface.

30. An electrically programmable and erasable memory device comprising:
   a substrate of semiconductor material of a first conductivity type;
   first and second spaced-apart regions formed in the substrate and having a second conductivity type, with a non-linear channel region therebetween;
   a block of conductive material disposed over the first region; and
   a floating gate disposed over and insulated from a surface of the substrate, and disposed laterally adjacent to and insulated from the block of conductive material;
   wherein the channel region defines a path for programming the floating gate with electrons from the second region.

31. The device of claim 30, wherein at least a portion of the non-linearity of the channel region is defined within a plane that is substantially perpendicular to the substrate surface.

32. The device of claim 31, wherein the channel region has a first portion that extends in a direction from the second region directly toward the floating gate.

33. The device of claim 32, wherein the direction is substantially perpendicular to the substrate surface.

34. The device of claim 32, wherein the channel region has a second portion that extends in a direction from the channel region first portion to the first region.

35. The device of claim 31, wherein the floating gate is a spacer.

36. The device of claim 30, wherein the block of conductive material is electrically connected to the first region.

37. An electrically programmable and erasable memory device comprising:
   a substrate of semiconductor material of a first conductivity type;
   an electrically conductive control gate having a first portion formed in the substrate;
   first and second spaced-apart regions formed in the substrate and having a second conductivity type, with a non-linear channel region therebetween, wherein the second region is formed underneath and is insulated from the control gate first portion, and the channel region includes a first portion that extends substantially along the control gate first portion and a second portion that extends substantially along a surface of the substrate;
   a block of conductive material disposed over the first region; and
   an electrically conductive floating gate disposed over and insulated from at least a portion of the channel region, and disposed laterally adjacent to and insulated from the block of conductive material.

38. The device of claim 37, wherein the control gate has a second portion disposed over and insulated from the floating gate.

39. The device of claim 37, wherein the floating gate is disposed over the entire second portion of the channel region.

40. The device of claim 39, wherein channel region first portion extends in a direction directly toward the floating gate.

41. The device of claim 37, wherein the block of conductive material is electrically connected to the first region.

42. An array of electrically programmable and erasable memory devices comprising:
   a substrate of semiconductor material of a first conductivity type and having a surface;
   spaced apart isolation regions formed on the substrate which are substantially parallel to one another and extend in a first direction, with an active region between each pair of adjacent isolation regions;
   each of the active regions including a plurality of memory cells, wherein each of the memory cells includes an electrically conductive floating gate disposed over and insulated from the substrate surface;
   a plurality of first regions formed in the substrate and having a second conductivity type, each of the first regions extends across the active regions and isolation regions in a second direction perpendicular to the first direction;
   a plurality of second regions formed in the substrate and having the second conductivity type, each of the second regions extends across the active regions and the isolation regions in the second direction and is disposed between a pair of the first regions, wherein the second regions are buried underneath the substrate surface;
   a plurality of blocks of conductive material that are substantially parallel to one another and extend across the active regions and isolation regions in the second direction, wherein each of the blocks of conductive material is disposed over one of the first regions and includes portions that are disposed laterally adjacent to and insulated from the floating gates; and
   a plurality of electrically conductive control gates each extending along one of the active regions in the first direction.

43. The array of claim 42, wherein each of the control gates includes a plurality of first portions that are each disposed in the substrate and over one of the second regions.

44. The array of claim 43, wherein for each of the active regions, the control gate therein has a second portion that is disposed over and insulated from the floating gates.

45. The array of claim 42, further comprising:

a plurality of channel regions in the substrate each extending between one of the first regions and one of the second regions.

46. The array of claim 45, wherein each of the channel regions has a first portion extending from one of the second regions toward the substrate surface, and a second portion extending substantially along the substrate surface.

47. The array of claim 42 wherein the second regions are integrally formed together in one of a plurality of conductive lines buried in the substrate, and wherein each of the conductive lines extends in the second direction and includes a raised portion that extends up to the substrate surface.

48. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions;

a plurality of spaced apart first and second regions formed in the semiconductor substrate having a second conductivity type and extending across the active and isolation regions in a second direction substantially perpendicular to the first direction, wherein the first and second regions have a second conductivity type and define a plurality of channel regions formed in the substrate therebetween;

a plurality of blocks of conductive material that are substantially parallel to one another and extend in the second direction, wherein each of the conductive blocks is disposed over and electrically connected to one of the first regions;

a plurality of floating gates of electrically conductive material each disposed over and insulated from at least a portion of one of the channel regions, and disposed laterally adjacent to and insulated from one of the blocks of conductive material; and a plurality of control gates of electrically conductive material extending in the first direction and having portions that are each disposed over and insulated from one of the floating gates.

49. The array of claim 48, wherein the floating gates are spacers.

50. The array of claim 49, wherein the floating gates each include at least one sharp edge that extends toward one of the control gates.

51. The array of claim 50, wherein for each of the memory cells, the floating gate is insulated from the control gate by an insulation layer having a thickness permitting Fowler-Nordheim tunneling of charges therethrough.

* * * * *